(12) United States Patent
Nakatsuka

(10) Patent No.: US 11,276,700 B2
(45) Date of Patent: Mar. 15, 2022

(54) SEMICONDUCTOR MEMORY DEVICE

(71) Applicant: KIOXIA CORPORATION, Tokyo (JP)

(72) Inventor: Keisuke Nakatsuka, Kobe Hyogo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/559,363

(22) Filed: Sep. 3, 2019

(65) Prior Publication Data
US 2020/0303389 A1    Sep. 24, 2020

(30) Foreign Application Priority Data

Mar. 20, 2019 (JP) .............................. JP2019-052475

(51) Int. Cl.
| | | |
|---|---|---|
| *H01L 27/11556* | (2017.01) | |
| *H01L 27/11582* | (2017.01) | |
| *H01L 23/528* | (2006.01) | |
| *H01L 21/8229* | (2006.01) | |
| *H01L 27/11514* | (2017.01) | |
| *H01L 21/822* | (2006.01) | |
| *G11C 16/04* | (2006.01) | |

(52) U.S. Cl.
CPC .... *H01L 27/11556* (2013.01); *G11C 16/0483* (2013.01); *H01L 21/822* (2013.01); *H01L 21/8229* (2013.01); *H01L 23/528* (2013.01); *H01L 27/11514* (2013.01); *H01L 27/11582* (2013.01)

(58) Field of Classification Search
CPC . H01L 21/822; H01L 21/8229; H01L 23/528; H01L 27/11514; H01L 27/11556; H01L 27/11582; H01L 27/11575; H01L 27/11565; G11C 16/0483; G06F 30/00
See application file for complete search history.

(56) References Cited

U.S. PATENT DOCUMENTS

| | | | |
|---|---|---|---|
| 7,514,321 B2 | 4/2009 | Mokhlesi | |
| 9,349,747 B2 | 5/2016 | Kim | |
| 9,627,401 B2 | 4/2017 | Tsuda | |
| 2016/0071593 A1* | 3/2016 | Hashimoto | ............ G11C 16/30 365/185.33 |
| 2017/0236779 A1* | 8/2017 | Komori | ............. H01L 23/53266 257/326 |

* cited by examiner

*Primary Examiner* — Galina G Yushina
(74) *Attorney, Agent, or Firm* — Foley & Lardner LLP

(57) ABSTRACT

A semiconductor memory device includes first conductive layers stacked on a substrate; second conductive layers stacked on the substrate and apart from the first conductive layer in a direction; third conductive layers stacked on the substrate and electrically connected to the first and second conductive layers; first insulating layers arranged in the direction to sandwich the first conductive layers; second insulating layers arranged in the direction to sandwich the second conductive layers; slit regions that sandwich the third conductive layers; and memory pillars disposed on the first and second insulating layers. The slit region is disposed between an end portion of one of the first insulating layers and an end portion of one of the second insulating layers.

13 Claims, 17 Drawing Sheets

SEMICONDUCTOR MEMORY DEVICE

CROSS-REFERENCE TO RELATED APPLICATION(S)

This application is based upon and claims the benefit of priority from Japanese Patent Application No. 2019-052475, filed Mar. 20, 2019, the entire contents of which are incorporated herein by reference.

FIELD

Embodiments described herein relate generally to a semiconductor memory device.

BACKGROUND

There is a semiconductor memory device in which memory cells are three-dimensionally arranged.

Examples of related art include JP-A-2016-92044.

DETAILED DESCRIPTION

Figure 1:
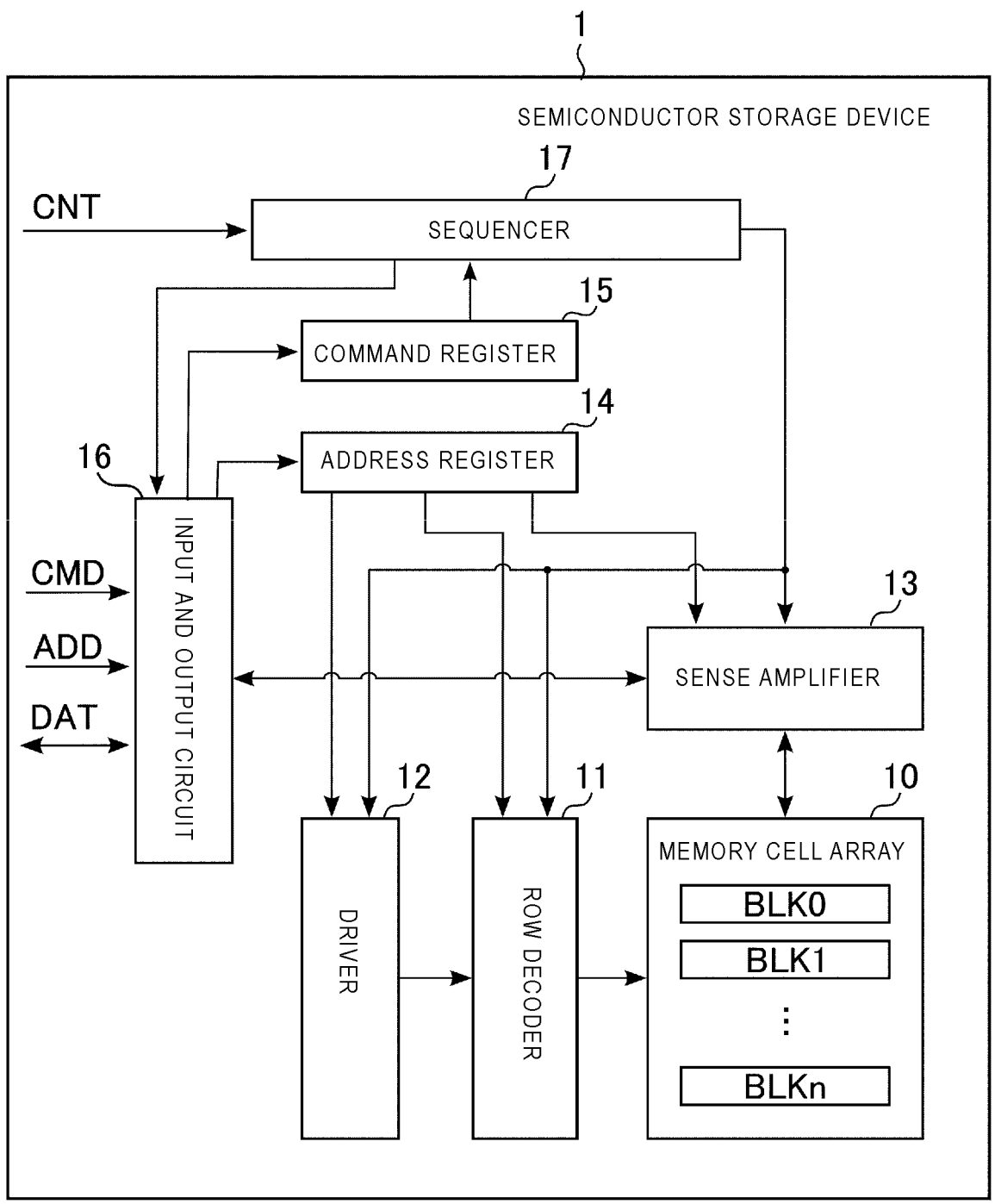
FIG. 1 is a block diagram illustrating a circuit configuration of a semiconductor memory device according to an embodiment.

Embodiments provide a semiconductor memory device that allows high-density arrangement of memory cells.

In general, according to one embodiment, a semiconductor memory device is provided. The semiconductor memory device includes: a plurality of first conductive layers that are stacked in a first direction on a substrate and extend in a second direction which intersects the first direction; a plurality of second conductive layers that are stacked in the first direction on the substrate and extend in the second direction, the second conductive layers being apart from the plurality of first conductive layers in a third direction which intersects the second direction; a plurality of third conductive layers that are stacked in the first direction on the substrate and are electrically connected to the first conductive layers and the second conductive layers; a first insulating layer and a second insulating layer that extend in the first direction and the second direction, and are arranged in the third direction to sandwich the first conductive layer; a third insulating layer and a fourth insulating layer that extend in the first direction and the second direction, and are arranged in the third direction to sandwich the second conductive layer; a first insulating region and a second insulating region that extend in the first direction and sandwich the third conductive layers; and a plurality of pillars that are disposed on the first insulating layer, the second insulating layer, the third insulating layer and the fourth insulating layer, and extend in the first direction. The first insulating region is disposed between an end portion of the first insulating layer and an end portion of the third insulating layer. The second insulating region is disposed between an end portion of the second insulating layer and an end portion of the fourth insulating layer.

Hereinafter, embodiments will be described with reference to the accompanying drawings. In the following description, components having the same function and configuration are denoted by the same reference numerals. The embodiments to be described below describe a device and a method to embody the technical idea of the embodiments, and do not specify materials, shapes, structures, arrangement and the like of components as follows.

Each functional block may be achieved by one of hardware and computer software, or a combination thereof. It is not necessary to separate each functional block as described in the following examples. For instance, some functions may be implemented by other functional blocks different from exemplary functional blocks. An exemplary functional block may be further divided into smaller functional sub-blocks. Here, a three-dimensionally stacked NAND flash memory in which a memory cell transistor is stacked above a semiconductor substrate is described as an instance of a semiconductor memory device. In the embodiments of the present disclosure, the memory cell transistor may be referred to as a memory cell.

1. First Embodiment

A semiconductor memory device according to the first embodiment will be described below.

1.1 Circuit Block Configuration of Semiconductor Storage Device

First, the circuit block configuration of the semiconductor memory device according to the first embodiment will be described. The semiconductor memory device according to the first embodiment is a NAND flash memory capable of storing data in a nonvolatile manner.

FIG. 1 is a block diagram illustrating the circuit configuration of the semiconductor memory device according to the first embodiment. The semiconductor memory device 1 includes a memory cell array 10, a row decoder 11, a driver 12, a sense amplifier 13, an address register 14, a command register 15, an input and output circuit 16, and a sequencer 17. For instance, an external device (for instance, a host device or a controller) (not illustrated) is connected to the semiconductor memory device 1 externally via a NAND bus.

1.1.1 Configuration of Block

The memory cell array 10 includes a plurality of blocks such as BLK0, BLK1, BLK2 . . . and BLKn (n is an integer more than or equal to 0). Each of the plurality of blocks BLK0 to BLKn includes a plurality of memory cell transistors corresponding to rows and columns. Each of the memory cell transistors may store data in the nonvolatile manner, and may electrically rewrite the data. In order to control a voltage applied to the memory cell transistors, a plurality of word lines, a plurality of bit lines and source lines are disposed in the memory cell array 10. Hereinafter, the blocks BLK0 to BLKn may be collectively referred to as blocks BLK. Details of the memory cell array 10 and the blocks BLK will be described below.

The row decoder 11 receives a row address from the address register 14 and decodes the row address. The row decoder 11 selects one of the blocks BLK and selects a word line in the selected block BLK based on a result of decoding the row address. The row decoder 11 transfers a plurality of voltages, which are necessary for a write operation, a read operation, and an erase operation, to the memory cell array 10.

The driver 12 supplies the plurality of voltages to the selected block BLK via the row decoder 11.

When data is being read, the sense amplifier 13 detects and amplifies the data read from the memory cell transistor to the bit line. When data is being written, the sense amplifier 13 transfers the written data DAT to the bit line.

The address register 14 stores, for instance, an address ADD received from the external device. The address ADD includes a block address that specifies a block BLK to be operated, and a page address that specifies a word line to be operated in the specified block. The command register 15 stores a command CMD received from the external device. The command CMD includes, for instance, a write command that instructs the sequencer 17 to perform the write operation, and a read command that instructs the sequencer 17 to perform the read operation.

The input and output circuit 16 is connected to the external device via a plurality of input and output lines (DQ lines). The input and output circuit 16 receives the command CMD and the address ADD from the external device. The input and output circuit 16 transmits the received command CMD to the command register 15, and transmits the received address ADD to the address register 14. The input and output circuit 16 transmits and receives the data DAT to and from the external device.

The sequencer 17 receives a control signal CNT from the external device. The control signal CNT includes a chip enable signal CEn, a command latch enable signal CLE, an address latch enable signal ALE, a write enable signal WEn, and a read enable signal REn and the like. Here, appended to a signal name indicates that the signal is low active.

The sequencer 17 controls operation of the semiconductor memory device 1 based on the command CMD stored in the command register 15 and the control signal CNT. Specifically, based on the write command received from the command register 15, the sequencer 17 controls the row decoder 11, the driver 12, and the sense amplifier 13 to write data in the plurality of memory cell transistors specified by the address ADD. Based on the read command received from the command register 15, the sequencer 17 controls the row decoder 11, the driver 12, and the sense amplifier 13 to read data from the plurality of memory cell transistors specified by the address ADD.

1.1.2 Circuit Configuration of Memory Cell Array 10

Next, the circuit configuration of the memory cell array 10 will be described. As described above, the memory cell array 10 includes the plurality of blocks BLK0 to BLKn. Here, the circuit configuration of one block BLK is described. It should be noted that circuit configurations of other blocks are also the same.

Figure 2:
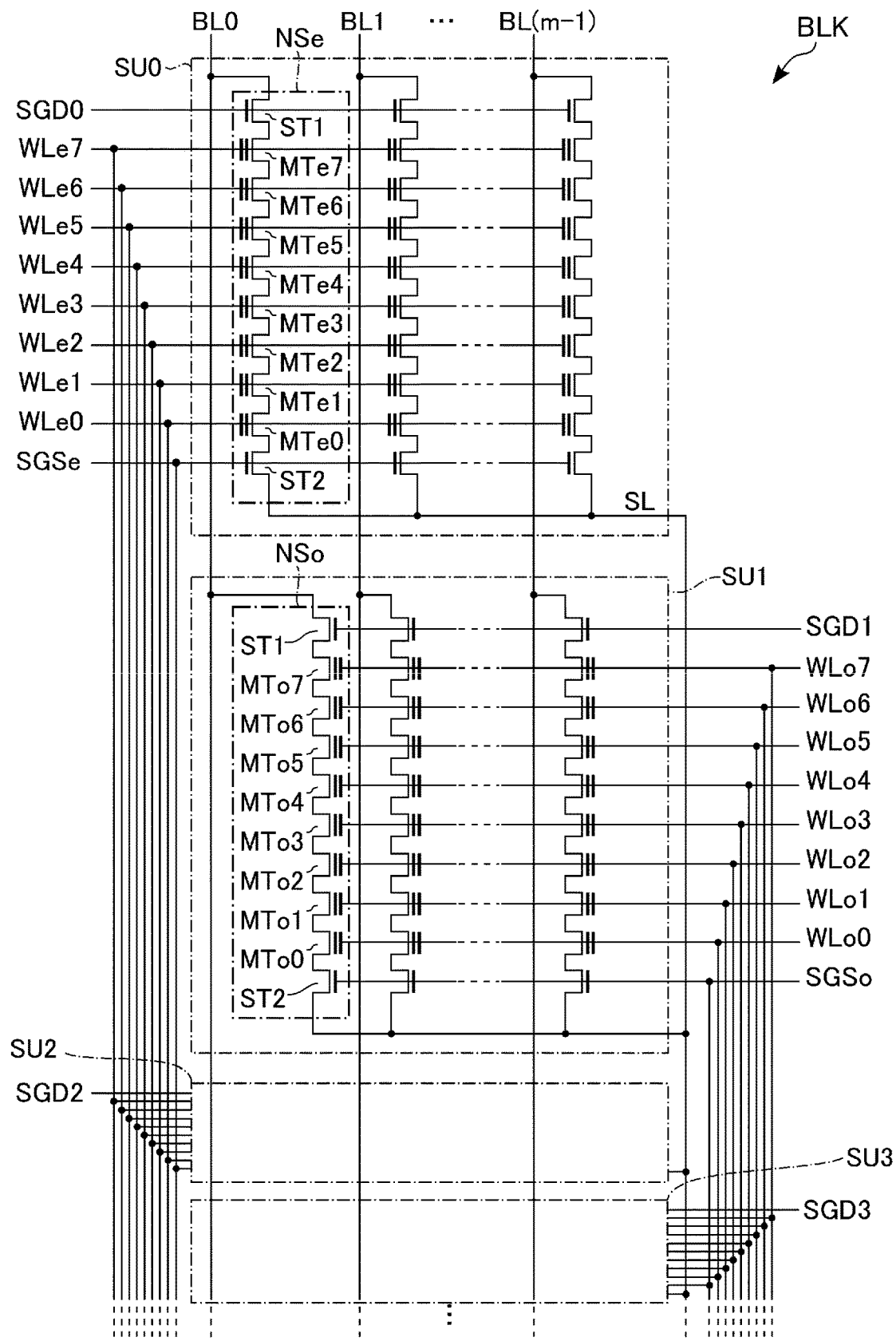
FIG. 2 is a circuit diagram of a block in a memory cell array in the embodiment.

FIG. 2 is a circuit diagram of one block BLK in the memory cell array 10. The block BLK includes a plurality of string units. Here, a case where the block BLK includes string units SU0, SU1, SU2 . . . and SU7 will be described as an instance. Each of the string units SU0 to SU7 corresponds to, for instance, one page as a write unit. FIG. 2 shows the string units SU0 to SU3. The number of string units in the block BLK may be set as desired. Hereinafter, the string units SU0 to SU7 may be collectively referred to as string units SU.

The string units SU0 to SU7 include even-numbered string units SU0, SU2, SU4, and SU6, and odd-numbered string units SU1, SU3, SU5, and SU7. Hereinafter, the even-numbered string units SU0, SU2, SU4, and SU6 may be collectively referred to as SUe, and the odd-numbered string units SU1, SU3, SU5, and SU7 may be collectively referred to as SUo.

The even-numbered string units SUe include a plurality of NAND strings NSe. The odd-numbered string units SUo include a plurality of NAND strings NSo. The NAND strings NSe and the NAND strings NSo are not distinguished, and may be collectively referred to as NAND strings NS.

The NAND strings NS include, for instance, eight memory cell transistors MT0, MT1, MT2, . . . and MT7 and select transistors ST1 and ST2. Here, a case where the NAND strings NS include eight memory cell transistors is shown as an instance. However, the number of memory cell transistors in the NAND strings NS may be set as desired.

Each of the memory cell transistors MT0 to MT7 includes a control gate and a charge storage layer and stores data in a nonvolatile manner. The memory cell transistors MT0 to MT7 are connected in series between a source of the select transistor ST1 and a drain of the select transistor ST2. Memory cell transistors MT may be of a metal-oxide-nitride-oxide-silicon (MONOS) type using an insulating film as the charge storage layer, and may be of a floating gate (FG) type using a conductive layer as the charge storage layer. Hereinafter, the memory cell transistors MT0 to MT7 may be collectively referred to as the memory cell transistors MT.

Gates of the select transistors ST1 in the string units SU0 to SU7 are respectively connected to select gate lines SGD0, SGD1, SGD2 . . . and SGD7. Each of the select gate lines SGD0 to SGD7 is independently controlled by the row decoder 11.

A gate of the select transistor ST2 in each of the even-numbered string units SU0, SU2 . . . and SU6 is connected to, for instance, a select gate line SGSe. A gate of the select transistor ST2 in each of the odd-numbered string units SU1, SU3 . . . and SU7 is connected to, for instance, a select gate line SGSo. Select gate lines SGSe and SGSo, for instance, may be connected as one wiring or separate wirings.

Control gates of the memory cell transistors MT0 to MT7 in the string units SUe in the same block BLK are respectively connected to word lines WLe0, WLe1, WLe2 ... and WLe7. On the other hand, the control gates of the memory cell transistors MT0 to MT7 in the string units SUo are respectively connected to word lines WLo0, WLo1, WLo2 ... and WLo7. Each of the word lines WLe0 to WLe7 and each of the word lines WLo0 to WLo7 are independently controlled by the row decoder 11.

The block BLK is, for instance, an erase unit of data. That is, data stored in the memory cell transistors MT in the same block BLK is collectively erased. The data may be erased in unit of the string units SU, or may be erased in unit of less than the string units SU.

Drains of the select transistors ST1 of the NAND strings NS in the same column in the memory cell array 10 are respectively connected to bit lines BL0 to BL (m−1), in which m is a natural number more than or equal to 1. That is, the bit lines BL0 to BL (m−1) commonly connect the NAND strings NS among the plurality of string units SU. Sources of the plurality of select transistors ST2 are connected to source lines SL.

That is, the string units SU include the plurality of NAND strings NS. The plurality of NAND strings NS are connected to different bit lines BL and connected to the same select gate line SGD. The block BLK includes a plurality of string units SUe that share the word lines WLe and a plurality of string units SUo that share the word lines WLo. The memory cell array 10 includes the plurality of blocks BLK that share the bit lines BL.

In the memory cell array 10, the select gate lines SGS, the word lines WL, and the select gate lines SGD are sequentially stacked above the semiconductor substrate, thereby forming the memory cell array 10 in which the select transistors ST2, the memory cell transistors MT, and the select transistors ST1 are three-dimensionally stacked.

The memory cell array 10 may have other configurations. That is, the configuration of the memory cell array 10 is described, for instance, in "THREE DIMENSIONAL STACKED NONVOLATILE SEMICONDUCTOR MEMORY" in U.S. patent application Ser. No. 12/407,403 filed on Mar. 19, 2009. In addition, the configuration is also described in "THREE DIMENSIONAL STACKED NON-VOLATILE SEMICONDUCTOR MEMORY" in U.S. patent application Ser. No. 12/406,524 filed on Mar. 18, 2009, in "NONVOLATILE SEMICONDUCTOR STORAGE DEVICE AND METHOD OF MANUFACTURING THE SAME" in U.S. patent application Ser. No. 12/679,991 filed on Mar. 25, 2010, and in "SEMICONDUCTOR MEMORY AND METHOD FOR MANUFACTURING SAME" in U.S. patent application Ser. No. 12/532,030 filed on Mar. 23, 2009. The entire contents of these patent applications are incorporated herein by reference.

1.2 Layout and Structure of Semiconductor Storage Device

Next, the layout and structure of the semiconductor memory device according to the first embodiment will be described.

1.2.1 Overall Layout of Semiconductor Storage Device

Figure 3:
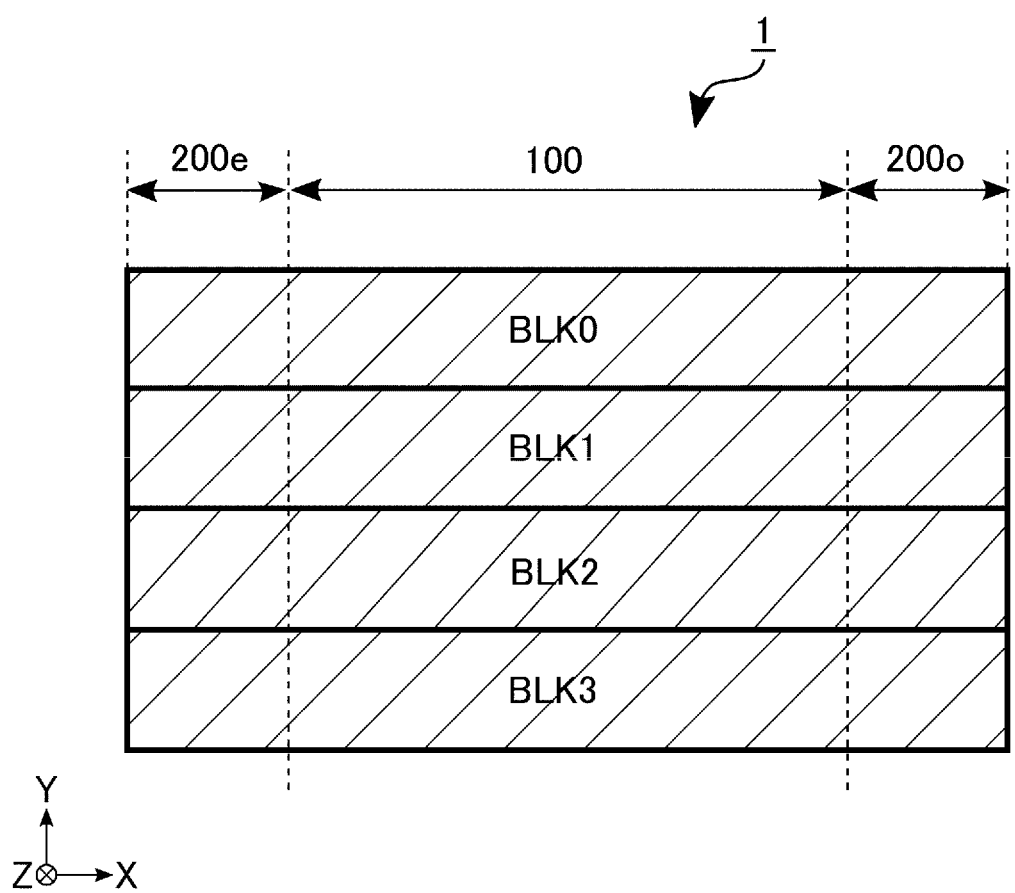
FIG. 3 describes an outline of a layout of the semiconductor memory device according to the embodiment.

FIG. 3 illustrates the layout of the semiconductor memory device according to the first embodiment. In subsequent drawings including FIG. 3, two directions that are parallel to a semiconductor substrate surface and orthogonal to each other are respectively set as an X direction and a Y direction; a direction orthogonal to a plane (XY plane) that includes the X direction and the Y direction is set as a Z direction (stack direction).

The semiconductor memory device 1 includes a memory array region 100 and hookup regions 200e and 200o. The hookup regions 200e and 200o are disposed on two ends of the memory array region 100 in the X direction to sandwich the memory array region 100 in the X direction. That is, the hookup region 200e is disposed on one end of the memory array region 100 in the X direction and the hookup region 200o is disposed on the other end of the memory array region 100 in the X direction.

The memory array region 100 includes the plurality of blocks BLK, and only blocks BLK0 to BLK3 are illustrated here. The blocks BLK0 to BLK3 are arranged in order in the Y direction.

1.2.1.1 Layouts of Memory Array Region and Hookup Region

Next, a part of the memory array region 100, the hookup regions 200e and 200o that are provided in the semiconductor memory device 1 will be described.

Figure 4:
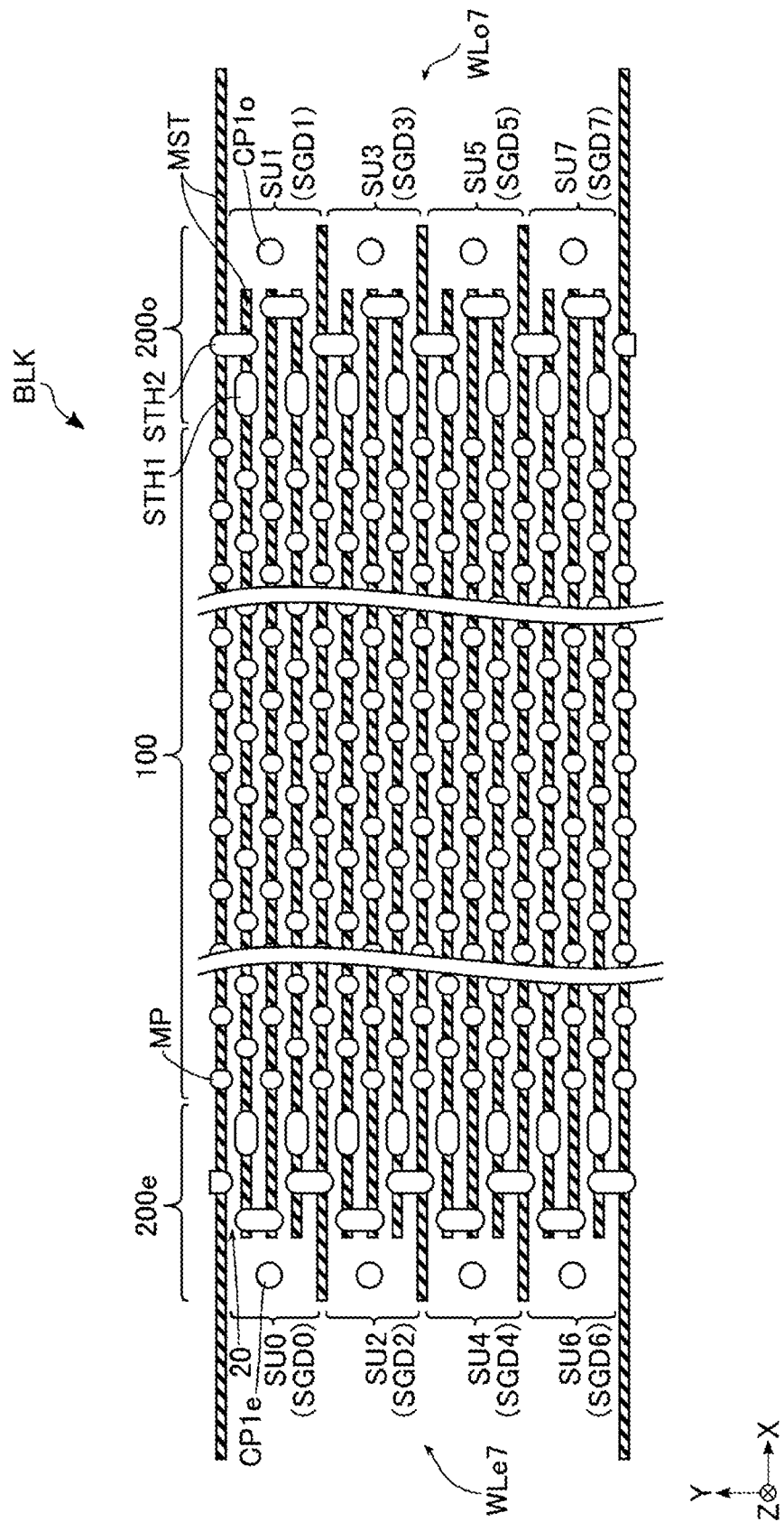
FIG. 4 is a plan view illustrating a part of a memory array region and a hookup region in the embodiment.

FIG. 4 describes an outline of the block BLK in FIG. 3, and illustrates a part of the memory array region 100 and the hookup regions 200e and 200o. In FIG. 4, in order to describe the outline of the layout, slit regions provided in the memory array region 100 are omitted, and layouts of memory trenches MST and the select gate lines SGD (or the word lines WL) are simply illustrated in a linear shape. Detailed layouts thereof will be described below with reference to FIG. 10.

As illustrated in FIG. 4, the memory array region 100 is provided, and the hookup regions 200e and 200o are respectively provided on one end of the memory array region 100 and the other end of the memory array region 100. In FIG. 4, the word line WLe7 among the word lines WLe0 to WLe7 and the word line WLo7 among the word lines WLo0 to WLo7 are separately illustrated as an instance.

As described above, the block BLK includes the string units SU0 to SU7. The select gate lines SGD0, SGD2, SGD4, and SGD6 of the string units SU0, SU2, SU4, and SU6, that is, of the string units SUe, and the word line WLe7 are drawn out in the hookup region 200e. Contact plugs CP1e respectively connect the select gate lines SGD0, SGD2, SGD4, and SGD6 to an upper-layer wiring (not illustrated). The word line WLe7 is provided below the select gate lines SGD0, SGD2, SGD4, and SGD6.

The select gate lines SGD1, SGD3, SGD5, and SGD7 of the string units SU1, SU3, SU5, and SU7, that is, of the string units SUo, and the word line WLo7, are drawn out in the hookup region 200o. Contact plugs CP1o respectively connect the select gate lines SGD1, SGD3, SGD5, and SGD7 to the upper-layer wiring (not illustrated). The word line WLo7 is provided below the select gate lines SGD1, SGD3, SGD5, and SGD7.

The block BLK includes a plurality of memory trenches MST, a plurality of memory pillars MP, a plurality of select gate lines SGD, and a plurality of word lines WL (not illustrated). The plurality of memory trenches MST are arranged at predetermined intervals in the Y direction. The memory trench MST is an insulating region, and includes, for instance, a silicon oxide layer.

The plurality of memory pillars MP are disposed on the memory trench MST at a predetermined interval in the X direction. Three memory trenches MST adjacent in the Y direction are respectively set as a first memory trench, a second memory trench, and a third memory trench. The memory pillar MP disposed on the first memory trench is set as a first memory pillar MP, the memory pillar MP disposed on the second memory trench is set as a second memory pillar MP, and the memory pillar MP disposed on the third memory trench is set as a third memory pillar MP. The first memory pillar MP and the third memory pillar MP are provided at the same position in the Y direction. The second memory pillar MP is located between the first memory pillar MP and the third memory pillar MP in the Y direction, and is disposed at a position different from the first memory pillar MP and the third memory pillar MP in the X direction. In other words, the plurality of memory pillars MP are disposed on the memory trenches MST in a staggered manner in the X direction and Y direction.

A conductive layer 20 is provided between adjacent memory trenches MST. The conductive layer 20 includes conductive layers 20-0 to 20-15 to be described below. The conductive layer 20 is connected by the hookup region 200$e$ or 200$o$, and corresponds to the select gate line SGD. The word lines WLe7 and WLo7 are provided below the select gate lines SGD.

The hookup regions 200$e$, 200$o$ are provided with slit regions STH1 on the memory trenches MST. The slit regions STH1 are alternately arranged on the memory trenches MST arranged in the Y direction. The slit region STH1 is a region in which an insulating material is buried in a hole used in a replacement step of the conductive layer (word line and select gate line) to be described below. The slit region STH1 is an insulating layer and includes, for instance, a silicon oxide layer.

Slit regions STH2 are provided on the memory trenches MST and the conductive layers 20 in the hookup regions 200$e$ and 200$o$. The slit regions STH2 are arranged in a staggered manner in the Y direction. The slit region STH2 is a region in which an insulating material is buried in a hole used in the conductive layer replacement step to be described below, and is a region in which every other conductive layer 20 is insulated and separated into the select gate lines SGDe and SGDo. In the replacement step, for instance, a sacrificial layer (for instance, an insulating layer) that exists in a region to be the word lines WL and the select gate lines SGD is removed, and the removed region is replaced with the conductive layer. The slit region STH2 is an insulating layer and includes, for instance, a silicon oxide layer.

The hookup regions 200$e$ and 200$o$ are provided with contact plugs respectively connected to a plurality of stacked word lines. However, the contact plugs are omitted here.

1.2.1.2 Cross-Sectional Structure of Memory Cell Array

Figure 5:
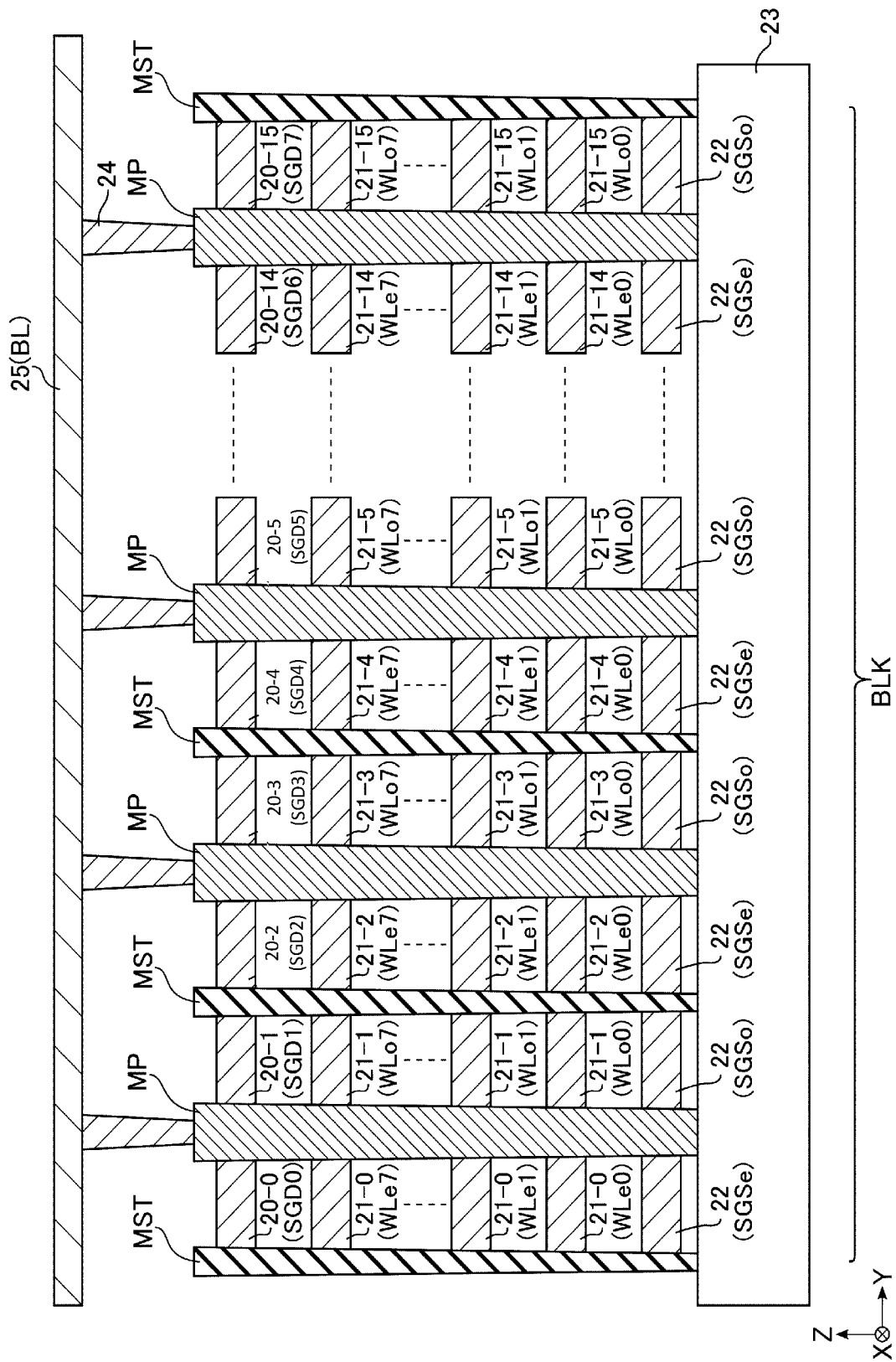
FIG. 5 is a cross-sectional view of the block taken along a Y direction in the embodiment.

Next, the cross-sectional structure of the block BLK in the memory cell array 10 will be described. FIG. 5 is the cross-sectional view of the block BLK along the Y direction. An insulating layer between the conductive layers and an insulating layer on the conductive layer are omitted.

As illustrated in FIG. 5, a conductive layer 22 is provided above a semiconductor substrate (for instance, a p-type well region) 23. The conductive layer 22 functions as the select gate lines SGSe and SGSo. Eight conductive layers 21 are stacked above the conductive layer 22 along the Z direction. Each of the conductive layers 21 includes conductive layers 21-0 to 21-15, and functions as the word lines WLe0 to WLe7 or WLo0 to WLo7.

A conductive layer 20 is provided above the conductive layer 21. The conductive layer 20 includes the conductive layers 20-0 to 20-15 and functions as the select gate lines SGD0 to SGD7.

The memory trenches MST and the memory pillars MP are alternately provided in the Y direction to reach the semiconductor substrate 23 from the conductive layer 20. As described above, the memory trenches MST are insulating layers. A contact plug for applying a voltage to a region provided in the semiconductor substrate 23 may be provided in the memory trench MST. For instance, a contact plug for connecting the source of the select transistor ST2 to the upper-layer wiring (not illustrated) may be provided.

The conductive layer 22 is disposed across the memory trenches MST or the memory pillars MP, and functions alternately as the select gate line SGSe or SGSo. Similarly, the conductive layer 21 is disposed across the memory trenches MST or the memory pillars MP, and functions alternately as the word line WLe or WLo.

The memory trench MST is also provided between adjacent blocks BLK in the Y direction. The contact plug for applying the voltage to the region provided in the semiconductor substrate 23 may be provided in the memory trench MST.

A contact plug 24 is provided on the memory pillar MP. A conductive layer 25 is provided on the contact plugs 24 along the Y direction. The conductive layer 25 functions as the bit line BL.

A cross section of the block BLK taken along the X direction will be described below.

Figure 6:
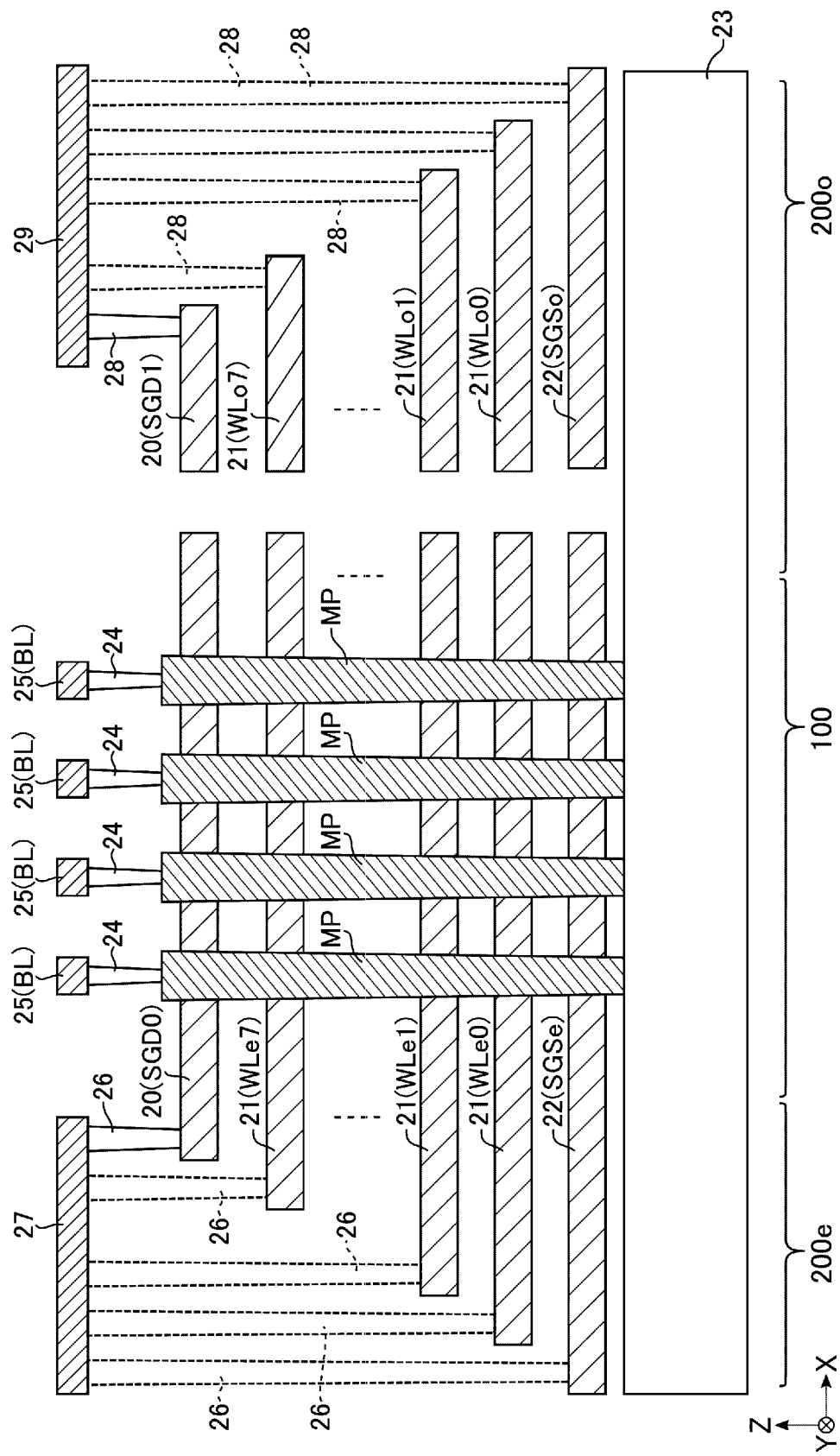
FIG. 6 is a cross-sectional view of the block taken along an X direction in the embodiment.

FIG. 6 is a cross-sectional view of the block BLK taken along the X direction, and illustrates a cross-sectional structure of a region that passes through the memory pillars MP along the select gate line SGD0 in FIG. 4 as an instance. The insulating layer between the conductive layers and the insulating layer on the conductive layer are omitted.

As described with reference to FIG. 5, the conductive layers 22, 21, and 20 are provided in order above the semiconductor substrate 23. The memory array region 100 is as described with reference to FIG. 5.

As shown in FIG. 6, in the hookup region 200$e$, the conductive layers 20 to 22 are drawn out, for instance, in a stepped manner. That is, in the hookup region 200$e$ when viewed in the XY plane, each of the conductive layers 20 to 22 has a terrace portion that does not overlap the upper conductive layer. A contact plug 26 is provided on the terrace portion. Contact plugs 26 are connected to a conductive layer 27. The contact plug 26 and the conductive layer 27 contain, for instance, a metal such as tungsten (W).

The conductive layers 20 to 22, which function as the even-numbered select gate lines SGD0, SGD2, SGD4, and SGD6, the even-numbered word lines WLe, and the even-numbered select gate lines SGSe, are separately electrically connected to the row decoder 11 by the plurality of conductive layers 27.

On the other hand, in the hookup region 200$o$, the conductive layers 20 to 22 are similarly drawn out, for instance, in the stepped manner. That is, in the hookup region 200$o$ when viewed in the XY plane, each of the conductive layers 20 to 22 has a terrace portion that does not overlap the upper conductive layer. A contact plug 28 is provided on the terrace portion. Contact plugs 28 are connected to a conductive layer 29. The contact plug 28 and the conductive layer 29 contain, for instance, a metal such as tungsten (W).

The conductive layers 20 to 22, which function as the odd-numbered select gate lines SGD1, SGD3, SGD5, and SGD7, the odd-numbered word lines WLo, and the odd-numbered select gate lines SGSo, are separately electrically connected to the row decoder 11 by the plurality of conductive layers 29.

1.2.1.3 Cross-Sectional Structure of Memory Pillar MP

Figure 7:
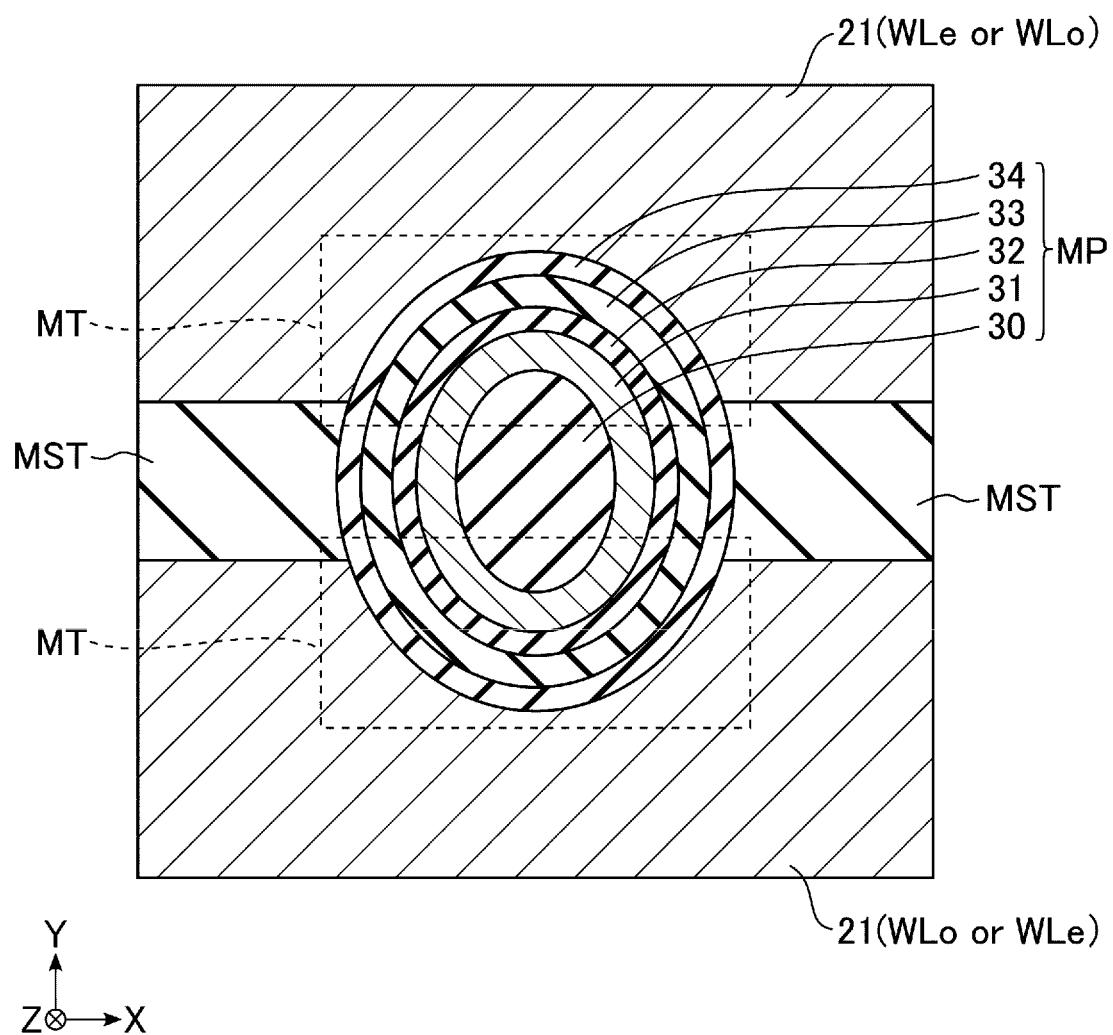
FIG. 7 is a cross-sectional view of a memory pillar taken along an XY plane in the embodiment.
Figure 8:
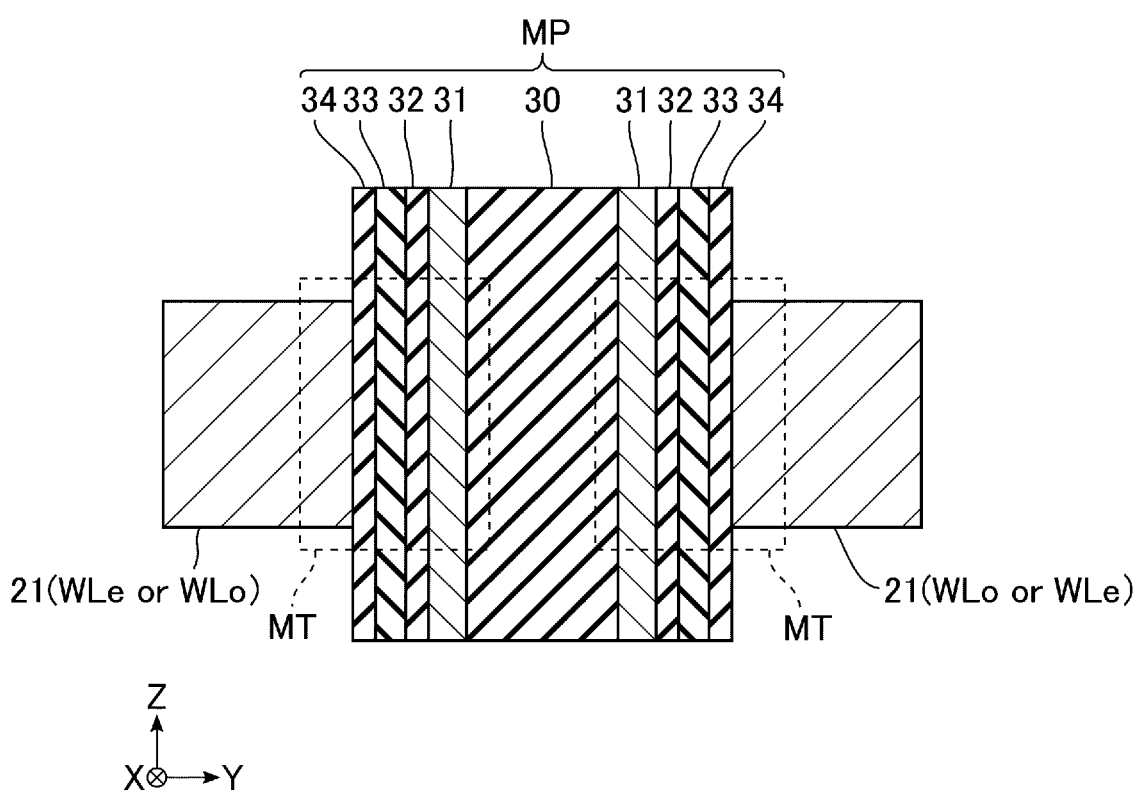
FIG. 8 is a cross-sectional view of the memory pillar taken along a YZ plane in the embodiment.

Next, structures and equivalent circuits of the memory pillar MP and the memory cell transistors MT will be described. FIG. 7 is a cross-sectional view of the memory pillar MP taken along the XY plane. FIG. 8 is a cross-sectional view of the memory pillar MP taken along an YZ plane. Each of FIGS. 7 and 8 particularly illustrates a region in which two memory cell transistors MT are provided.

As illustrated in FIGS. 7 and 8, the memory pillar MP includes an insulating layer 30, a semiconductor layer 31, and insulating layers 32 to 34. The word line WLe or WLo includes the conductive layer 21.

The insulating layer 30, the semiconductor layer 31, and each of the insulating layers 32 to 34 extend along the Z direction. The insulating layer 30 is, for instance, a silicon oxide layer. The semiconductor layer 31 surrounds a side surface of the insulating layer 30. The semiconductor layer 31 functions as a region in which a channel of the memory cell transistor MT is formed. The semiconductor layer 31 is, for instance, a polycrystalline silicon layer.

The insulating layer 32 surrounds a side surface of the semiconductor layer 31. The insulating layer 32 functions as a gate insulating film of the memory cell transistor MT. The insulating layer 32 includes, for instance, a stacked structure of a silicon oxide layer and a silicon nitride layer. The insulating layer 33 surrounds a side surface of the insulating layer 32. The insulating layer 33 functions as a charge storage layer of the memory cell transistor MT. The insulating layer 33 is, for instance, a silicon nitride layer. The insulating layer 34 surrounds a side surface of the insulating layer 33. The insulating layer 34 functions as a block insulating film of the memory cell transistor MT. The insulating layer 34 is, for instance, a silicon oxide layer. In the memory trench MST excluding the memory pillar MP, for instance, an insulating layer such as a silicon oxide layer is buried.

With the above configuration, in each of the conductive layers 21, two memory cell transistors MT are provided in one memory pillar MP along the Y direction. The select transistors ST1 and ST2 have the same configuration.

Figure 9:
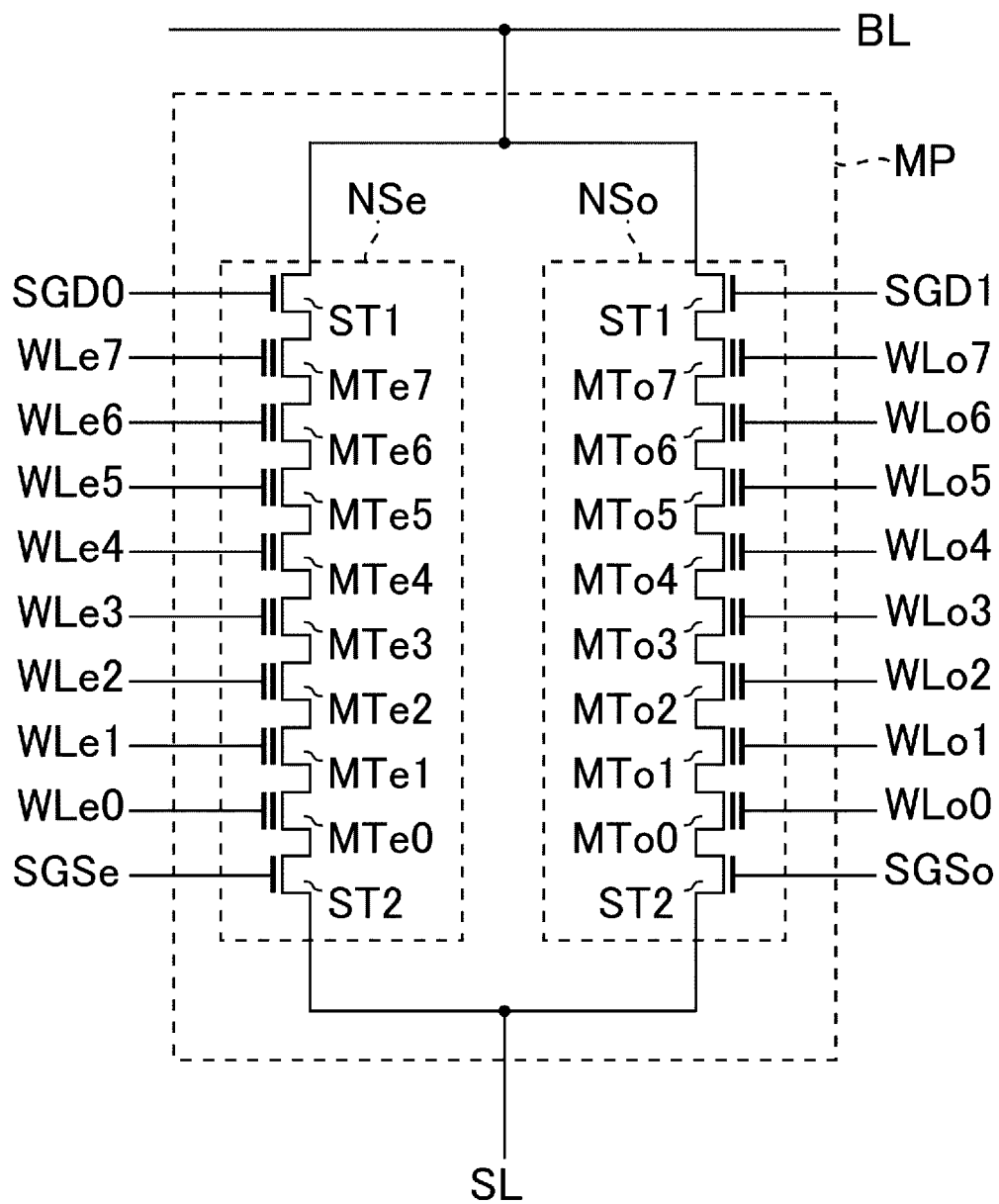
FIG. 9 is an equivalent circuit diagram of the memory pillar in the embodiment.

The equivalent circuit of the memory pillar MP will be described below. FIG. 9 is an equivalent circuit diagram of the memory pillar MP. As shown in the drawing, two NAND strings NSe, NSo are formed in one memory pillar MP. That is, two select transistors ST1, which are provided in one memory pillar MP, are respectively connected to different select gate lines, for instance, SGD0 and SGD1. The memory cell transistors MTe0 to MTe7 and MTo0 to MTo7 are respectively connected to different word lines WLo and WLe. The select transistors ST2 are also respectively connected to different select gate lines SGSe and SGSo.

One ends of two NAND strings NSe and NSo in the memory pillar MP are connected to the same bit line BL, and the other ends thereof are connected to the same source line SL. The two NAND strings NSe and NSo share a back gate (semiconductor layer 31).

1.2.1.4 Detailed Configuration of Memory Array Region

Next, the layout configuration of the memory trenches MST, the memory pillars MP, the select gate lines SGDe and SGDo, the word lines WLe and WLo, and the slit regions in the memory array region 100 according to the first embodiment will be described.

As described above, the string units SU0 to SU7 are provided in the block BLK. The string units SU1 to SU7 have the same layout configuration. In the memory array region 100, the select gate lines SGDe and SGDo as well as the word lines WLe0 and WLo0 to WLe7 and WLo7 respectively have the same layout configuration. Therefore, in the following embodiments including the present embodiment, the word lines WLe7 and WLo7 in the string unit SU0 are described as an instance. The first embodiment describes an instance in which an extension direction of the memory trench MST is in parallel to the X direction.

a. First Example

Figure 10:
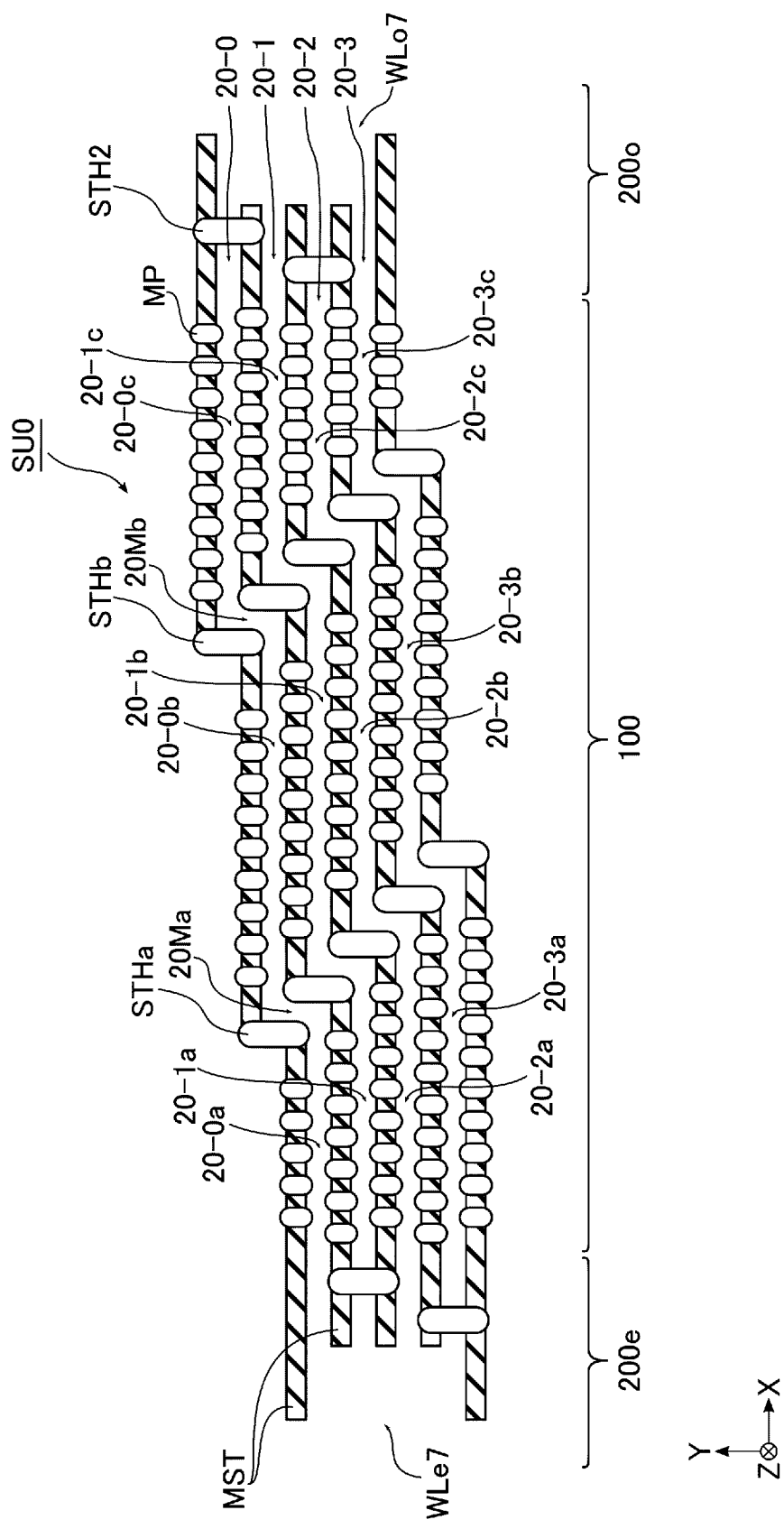
FIG. 10 is a plan layout of memory trenches, memory pillars, word lines, and slit regions in a first example according to a first embodiment.

FIG. 10 is a plan layout of the memory trenches MST, the memory pillars MP, the word lines WLe7 and WLo7, and the slit regions STHa and STHb in the memory array region 100 of the first example.

As illustrated in FIG. 10, the conductive layers 20-0 to 20-3 that extend in the X direction are arranged along the Y direction. The conductive layers 20-0 and 20-2 are electrically connected to each other at one end in the X direction, and function as a part of the word line WLe7. The conductive layers 20-1 and 20-3 are electrically connected to each other at the other end in the X direction, and function as a part of the word line WLo7. The word lines WLe7 and WLo7 are separately connected to the upper-layer wiring (not illustrated) via the contact plugs in the hookup regions 200e and 200o, and are further connected to the row decoder 11.

The conductive layers 20 adjacent to each other in the Y direction are separated by the memory trench MST. The memory trench MST is, for instance, a region filled with an insulating material. The region can extend from the semiconductor substrate surface to a layer where the conductive layer 20 is provided.

The plurality of memory pillars MP are arranged in a staggered manner in the X direction and the Y direction in the memory trench MST. Specifically, the plurality of memory pillars MP are arranged at a predetermined interval in the X direction on the memory trench MST that is between the conductive layers 20 adjacent in the Y direction. Each of the memory pillars MP is disposed on the memory trench MST that is between two conductive layers 20. In other words, each of the memory pillars MP straddles two conductive layers 20 that sandwich the memory trench MST.

Each of the memory pillars MP passes through the memory trench MST and the conductive layer 20, and extends along the Z direction. The memory pillar MP is a columnar body including the memory cell transistors MT and the select transistors ST1 and ST2. Details of the memory pillar MP will be described below.

As illustrated in FIG. 10, the conductive layer 20-0 includes, from one end to the other end of the memory array region 100, a plurality of linear conductive layers 20-0a, 20-0b, and 20-0c that are divided by the slit regions STHa and STHb, and includes conductive layers 20Ma and 20Mb that connect these linear conductive layers. Here, three conductive layers 20-0a to 20-0c are illustrated. However, any number of linear conductive layers that correspond to the number of the slit regions and conductive layers that connect these linear conductive layers can exist. Hereinafter, the slit regions STHa and STHb may be collectively referred to as the slit regions STH.

The conductive layer 20-0a is a linear portion from one end of the memory array region 100 to the slit region STHa. The conductive layer 20-0b is a linear portion from the slit region STHa to the slit region STHb. The conductive layer 20-0c is a linear portion from the slit region STHb to the other end of the memory array region 100.

The conductive layers 20-0a and 20-0b are electrically connected by the conductive layer 20Ma provided between the conductive layer 20-0a and the conductive layer 20-0b. The conductive layers 20-0b and 20-0c are electrically connected by the conductive layer 20Mb provided between the conductive layer 20-0b and the conductive layer 20-0c. The integrally formed conductive layer 20-0 includes the conductive layers 20-0a, 20Ma, 20-0b, 20Mb, and 20-0c.

In other words, an edge portion of the conductive layer 20-0a is bent in the Y direction at the slit region STHa and is connected to the conductive layer 20-0b via the conductive layer 20Ma. An edge portion of the conductive layer 20-0b is bent in the Y direction at the slit region STHb, and is connected to the conductive layer 20-0c via the conductive layer 20Mb.

As described above, the conductive layer 20-1 includes, from one end to the other end of the memory array region 100, a plurality of linear conductive layers 20-1a, 20-1b, and 20-1c that are divided by the slit regions STHa and STHb, and includes the conductive layers 20Ma and 20Mb that connect these linear conductive layers. An edge portion of the conductive layer 20-1a is bent in the Y direction at the slit region STHa, and is connected to the conductive layer 20-1b via the conductive layer 20Ma. An edge portion of the conductive layer 20-1b is bent in the Y direction at the slit region STHb, and is connected to the conductive layer 20-1c via the conductive layer 20Mb.

As described above, a conductive layer 20-2 also includes, from one end to the other end of the memory array region 100, a plurality of linear conductive layers 20-2a, 20-2b, and 20-2c that are divided by the slit regions STHa and STHb, and includes the conductive layers 20Ma and 20Mb that connect these linear conductive layers. An edge portion of the conductive layer 20-2a is bent in the Y direction at the slit region STHa, and is connected to the conductive layer 20-2b via the conductive layer 20Ma. An edge portion of the conductive layer 20-2b is bent in the Y direction at the slit region STHb, and is connected to the conductive layer 20-2c via the conductive layer 20Mb.

As described above, the conductive layer 20-3 also includes, from one end to the other end of the memory array region 100, a plurality of linear conductive layers 20-3a, 20-3b, and 20-3c that are divided by the slit regions STHa and STHb, and includes the conductive layers 20Ma and 20Mb that connect these linear conductive layers. An edge portion of the conductive layer 20-3a is bent in the Y direction at the slit region STHa, and is connected to the conductive layer 20-3b via the conductive layer 20Ma. An edge portion of the conductive layer 20-3b is bent in the Y direction at the slit region STHb, and is connected to the conductive layer 20-3c via the conductive layer 20Mb.

In other words, each of the conductive layers 20-0 to 20-3 extends in the X direction with a predetermined length, and is bent in a stepped manner in the Y direction at each predetermined length. The slit region STHa or STHb is disposed between end portions of two memory trenches MST that are adjacent to each other in the Y direction.

The slit region STH has, for instance, an oval shape (or an elliptical shape). A major axis direction (or a long axis direction) of the slit region STH is the Y direction, that is, a direction substantially orthogonal to the extension direction of the memory trench MST in the first example.

In the slit region STH, as described above, the hole used in the replacement step of the word line WL and the select gate line SGD is filled with an insulating material. In the replacement step, a sacrificial layer formed in a region in which the word line WL and the select gate line SGD are to be formed is removed, and is replaced with the conductive layer. Therefore, between one end and the other end of the memory array area 100, a necessary number of slit regions STH for the replacement step are provided. Two slit regions STHa and STHb are illustrated here. It should be noted that the number of the slit regions STH provided in the memory array region 100 is set to a predetermined number in design.

The configuration of the first example illustrated in FIG. 10 may be expressed as follows.

The semiconductor memory device 1 of the first example includes: the semiconductor substrate 23; a first memory trench MST that extends in the Z direction perpendicular to a surface of the semiconductor substrate 23 and in the X direction that intersects the Z direction; a second memory trench MST that extends in the Z direction and the X direction and is disposed apart from the first memory trench MST in the Y direction which intersects the Z direction and the X direction; a third memory trench MST that extends in the Z direction and the X direction and is disposed apart from the first memory trench MST in the Y direction; a fourth memory trench MST that extends in the Z direction and the X direction and is disposed apart from the third memory trench MST in the Y direction, the fourth memory trench MST being at the same position as the first memory trench MST in the Y direction; a first conductive layer 20-0a that is provided between the first memory trench MST and the second memory trench MST and is stacked in the Z direction, the first conductive layer 20-0a extending in the X direction; a second conductive layer 20-0b that is provided between the third memory trench MST and the fourth memory trench MST and is stacked in the Z direction, the second conductive layer 20-0b extending in the X direction; a third conductive layer 20Ma electrically connected to the first conductive layer 20-0a and the second conductive layer 20-0b; a first slit region STHa connected to one end of the first memory trench MST and one end of the third memory trench MST; a second slit region STHa connected to one end of the second memory trench MST and one end of the fourth memory trench MST; a plurality of signal lines (memory pillars MP) that are disposed on the first memory trench MST along the X direction and extend in the Z direction; and a memory cell that stores first information between the first conductive layer 20-0a and each of the plurality of signal lines.

One end of the second memory trench MST protrudes in the X direction from a position where the first slit region STHa is provided.

b. Second Example

Figure 11:
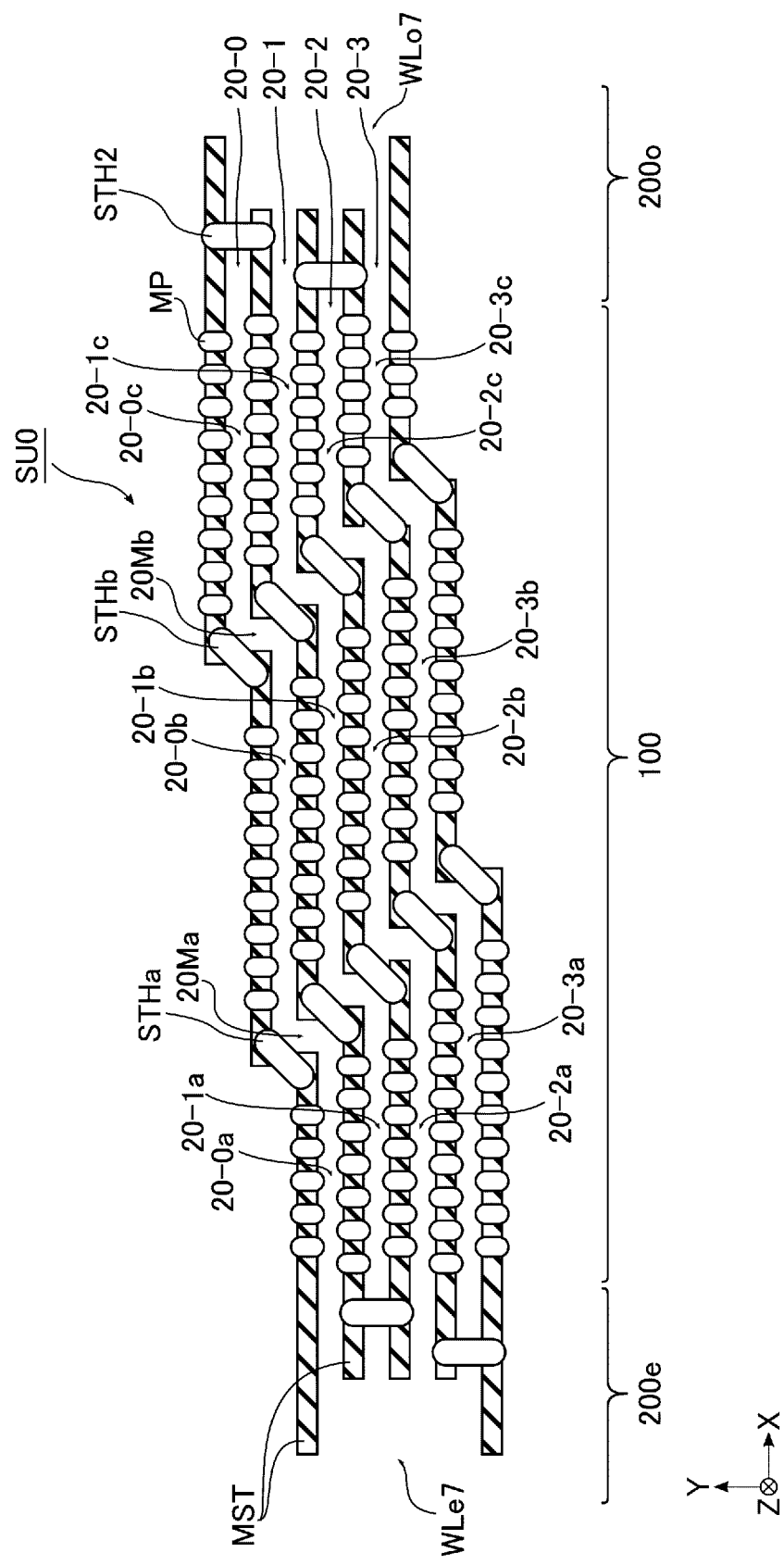
FIG. 11 is a plan layout of memory trenches, memory pillars, word lines, and slit regions in a second example according to the first embodiment.

FIG. 11 is a plan layout of the memory trenches MST, the memory pillars MP, the word lines WLe7 and WLo7, and the slit regions STH in the memory array region 100 of the second example.

In the first example described above, the major axis direction (or the long axis direction) of the slit region STH is disposed in a direction substantially orthogonal to the extension direction of the memory trench MST (that is, the Y direction). However, in the second example, the major axis direction of the slit region STH is disposed obliquely to the extension direction of the memory trench MST. In other words, the major axis direction of the slit region STH intersects the Z direction and is different from the X direction and the Y direction. An angle formed by the major axis direction of the slit region STH and the memory trench MST (for instance, the memory trench MST adjacent to the conductive layer 20-0a) is greater than 90 degrees. For instance, the major axis direction of the slit region STH is reached by rotating about 45 degrees clockwise from the Y direction. Other configurations are the same as those of the first example.

The configuration of the second example illustrated in FIG. 11 may be expressed as follows.

Widths of the first slit region STHa and the second slit region STHa are greater in the Y direction than in the X direction.

The first slit region STHa and the second slit region STHa extend from the X direction toward the Y direction.

c. Third Example

Figure 12:
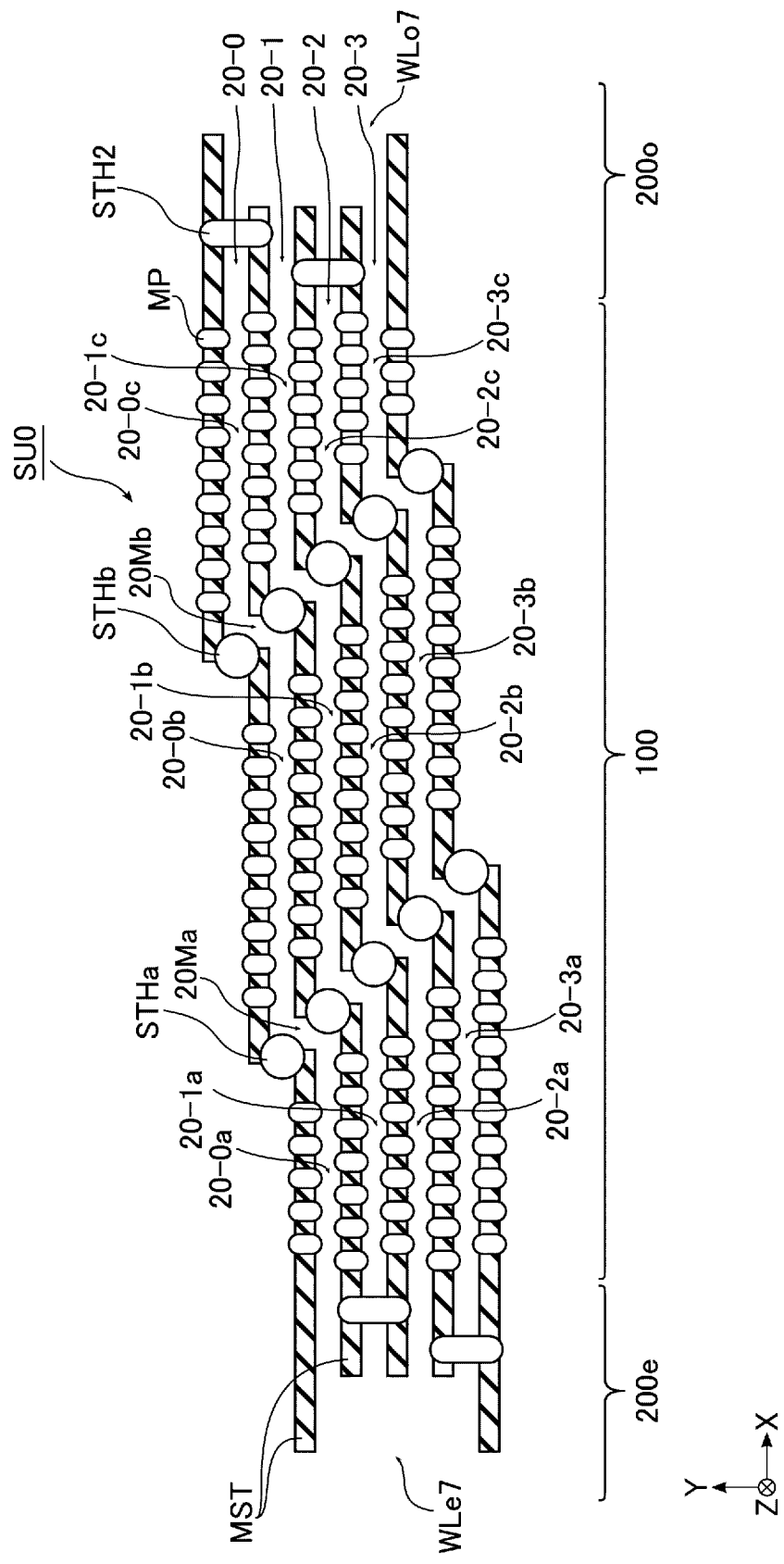
FIG. 12 is a plan layout of memory trenches, memory pillars, word lines, and slit regions in a third example according to the first embodiment.

FIG. 12 is a plan layout of the memory trenches MST, the memory pillars MP, the word lines WLe7 and WLo7, and the slit regions STH in the memory array region 100 of the third example.

In the first and second examples described above, the shape of the slit region STH is oval. However, in the third example, the shape of the slit region STH is close to a perfect circle. Other configurations are the same as those of the first example.

1.3 Effects of First Embodiment

According to the first embodiment, it is possible to provide a semiconductor memory device that allows high-density arrangement of memory cells.

Hereinafter, problems of a memory trench MST and a slit region STH in a semiconductor memory device as a comparative instance will be described. Each of a plurality of memory trenches MST in the comparative example extends in the X direction and is arranged in the Y direction. The oval slit region STH is disposed with its major axis direction along the X direction. In such a configuration, the pitch at which the memory trenches MST are arranged in the Y direction is limited by the width of the slit region STH in the minor axis direction. Therefore, there is a concern that the distance between adjacent memory trenches MST cannot be reduced, and the number of memory trenches MST (or memory pillars MP) that can be provided in a memory cell array cannot be increased, that is, the number of memory cells cannot be increased.

Therefore, in the first example according to the first embodiment, the plurality of memory trenches MST arranged in the Y direction are respectively provided with the oval slit regions STH to connect end portions of two memory trenches MST, and the major axis direction of the slit region STH is substantially orthogonal to the extension direction (or the X direction) of the memory trench MST. In the third example, the circular slit regions STH are respectively provided to connect end portions of two memory trenches MST.

Accordingly, the pitch at which the memory trenches MST are arranged in the Y direction can be reduced. That is, the distance between the adjacent memory trenches MST can be reduced. Accordingly, the number of the memory trenches MST (or memory pillars MP) that can be provided in the memory cell array can be increased, the memory cells can be disposed in high density, or storage capacity of the memory cell array can be increased.

In the second example, the major axis direction of the slit region STH is oblique to the extension direction of the memory trench MST. Accordingly, the pitch at which the memory trenches MST are arranged in the Y direction can be further reduced, the distance between the slit regions STH becomes long, and the width of the slit region STH in the minor axis direction can be increased. Accordingly, the number of the memory trenches MST (or memory pillars MP) provided in the memory cell array can be increased, the memory cells can be disposed in high density, and the reliability of the memory cells provided in the memory cell array can be improved.

2. Second Embodiment

Next, a semiconductor memory device according to a second embodiment will be described. The second embodiment is an instance in which an extension direction of the memory trench MST is oblique to the X direction. In the second embodiment, differences from the first embodiment will be mainly described. Other configurations not described are the same as those of the first embodiment.

2.1 Detailed Configuration of Memory Array Region a. First Example

Figure 13:
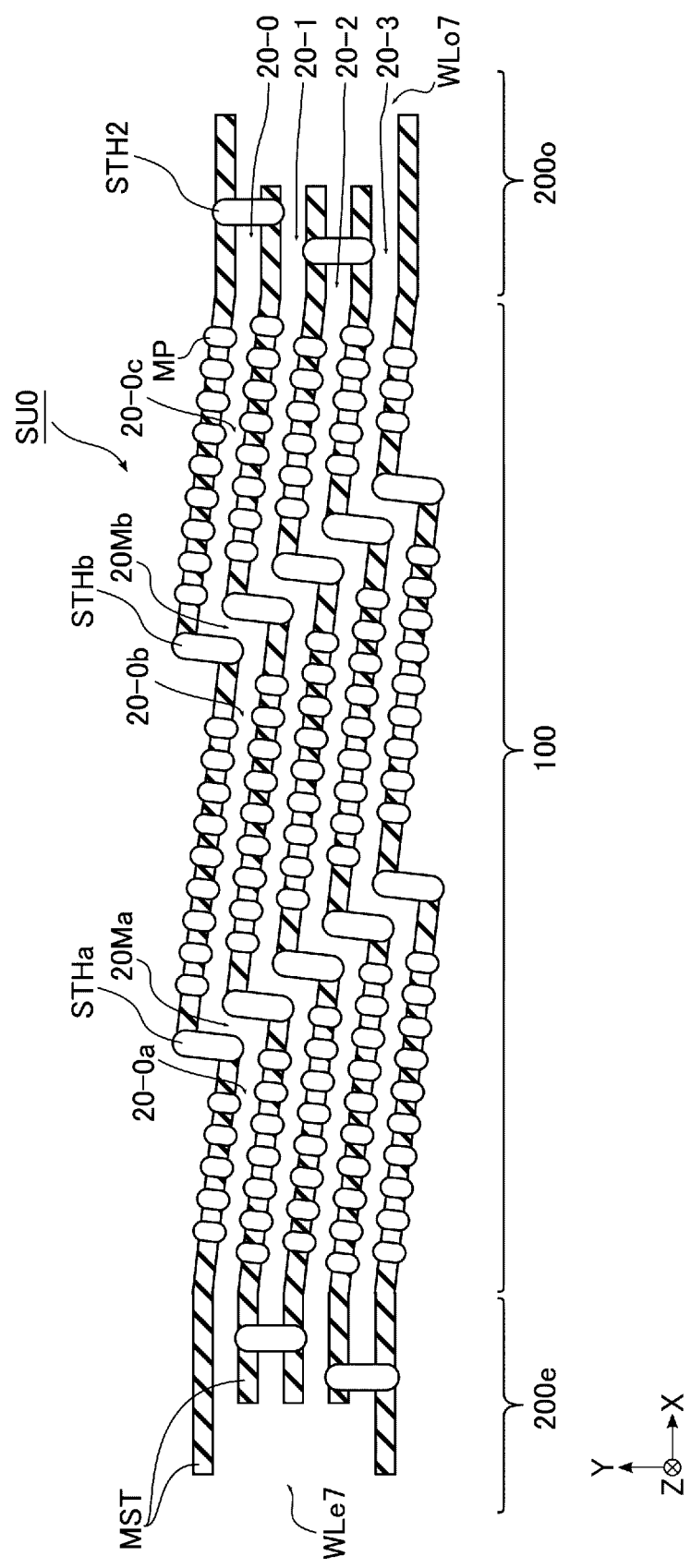
FIG. 13 is a plan layout of memory trenches, memory pillars, word lines, and slit regions in a first example according to a second embodiment.

FIG. 13 is a plan layout of the memory trenches MST, the memory pillars MP, the word lines WLe7 and WLo7, and the slit regions STH in the memory array region 100 of the first example.

In the first embodiment described above, the extension direction of the memory trench MST is in parallel to the X direction. However, in the first example according to the second embodiment, an extension direction of the memory trench MST is oblique to the X direction. That is, the extension direction of the memory trench MST is a direction (hereinafter, referred to as an X1 direction) having a predetermined angle with respect to the X direction.

An extension direction of the conductive layers 20-0a, 20-0b, and 20-0c in the conductive layer 20-0 is oblique to the X direction, that is, in the X1 direction, which is similar to the extension direction of the memory trench MST. An extension direction of the conductive layers 20-1a, 20-1b, and 20-1c in the conductive layer 20-1, an extension direction of the conductive layers 20-2a, 20-2b, and 20-2c in the conductive layer 20-2, and an extension direction of the conductive layers 20-3a, 20-3b, and 20-3c in the conductive layer 20-3 are also oblique to the X direction, that is, in the X1 direction.

A major axis direction (or long axis direction) of the slit regions STHa and STHb is substantially orthogonal to the extension direction of the memory trench MST.

The hookup region 200e is provided with the word line WLe7. The word line WLe7 is connected to the layer 20-0a in the conductive layer 20-0 and to the layer 20-2a in the conductive layer 20-2, separately. As described above, the extension direction of the memory trench MST is oblique to the X direction. Thus, the word line WLe7 is in parallel to the X direction, that is, extends along the X direction.

The hookup region 200o is provided with the word line WLo7. The word line WLo7 is connected to the layer 20-1c in the conductive layer 20-1 and to the layer 20-3c in the conductive layer 20-3. The extension direction of the memory trench MST is oblique to the X direction. Thus, the word line WLo7 is in parallel to the X direction, that is, extends along the X direction.

b. Second Example

Figure 14:
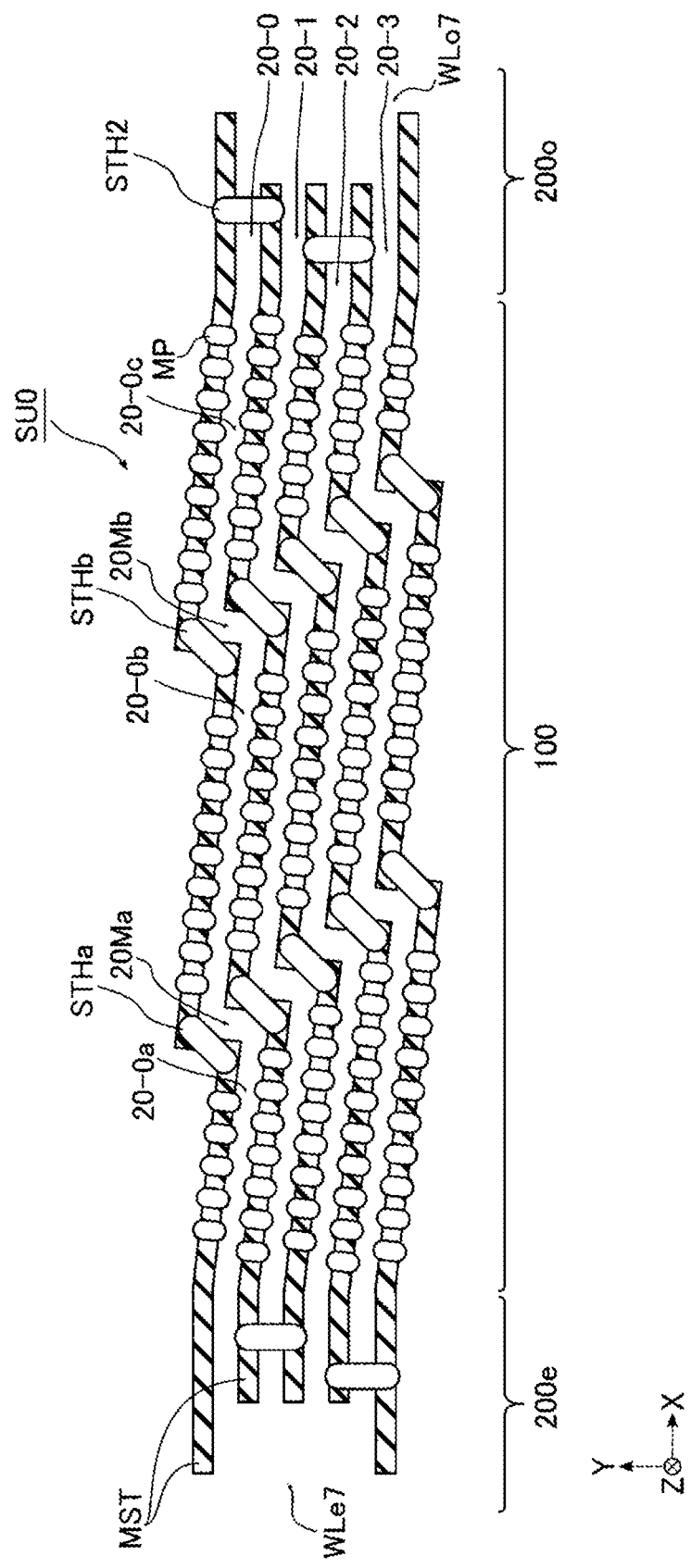
FIG. 14 is a plan layout of memory trenches, memory pillars, word lines, and slit regions in a second example according to the second embodiment.

FIG. 14 is a plan layout of the memory trenches MST, the memory pillars MP, the word lines WLe7 and WLo7, and the slit regions STH in the memory array region 100 of the second example.

In the first example described above, the major axis direction of the slit region STH is disposed in a direction substantially orthogonal to the extension direction of the memory trench MST. However, in the second example, a major axis direction of the slit region STH is disposed obliquely to the extension direction of the memory trench MST. That is, the major axis direction of the slit region STH is in a direction having a predetermined angle with the extension direction of the memory trench MST. The angle formed by the major axis direction of the slit region STH and the memory trench MST (for instance, the memory trench MST adjacent to the conductive layer 20-0a) is greater than 90 degrees. Other configurations are the same as those of the first example according to the second embodiment.

c. Third Example

Figure 15:
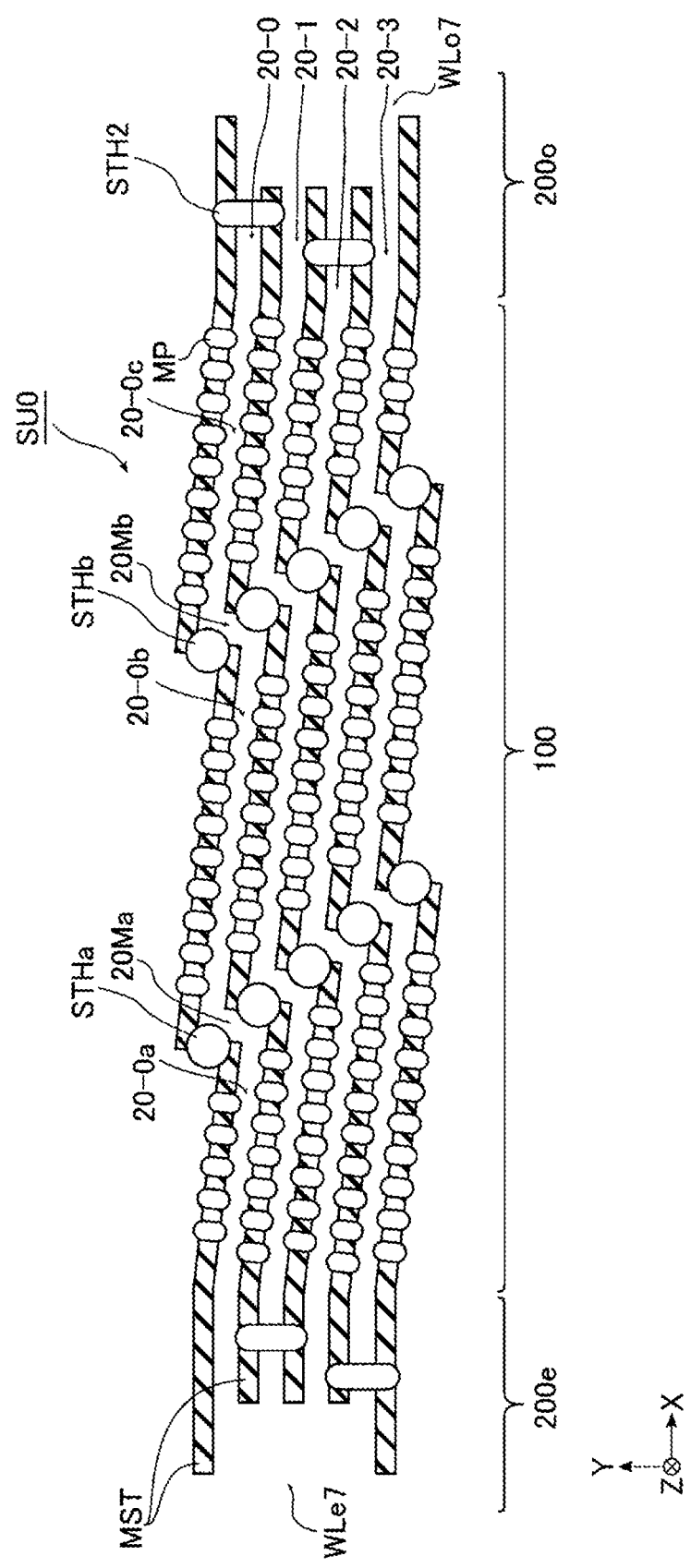
FIG. 15 is a plan layout of memory trenches, memory pillars, word lines, and slit regions in a third example according to the second embodiment.

FIG. 15 is a plan layout of the memory trenches MST, the memory pillars MP, the word lines WLe7 and WLo7, and the slit regions STH in the memory array region 100 of the third example.

In the first and second examples described above, the shape of the slit region STH is oval. However, in the third example, the shape of the slit region STH is close to a perfect circle. Other configurations are the same as those of the first example described above.

2.3 Effects of Second Embodiment

According to the second embodiment, it is possible to provide a semiconductor memory device that allows high-density arrangement of memory cells, which is similar to the first embodiment.

In the second embodiment, the extension direction of the memory trench MST is oblique to the X direction. Accordingly, the conductive layer 20 between the memory trenches MST can be prevented from moving in the Y direction by the conductive layers 20Ma and 20Mb. Other effects are the same as those of the first embodiment described above.

3. Third Embodiment

Figure 16:
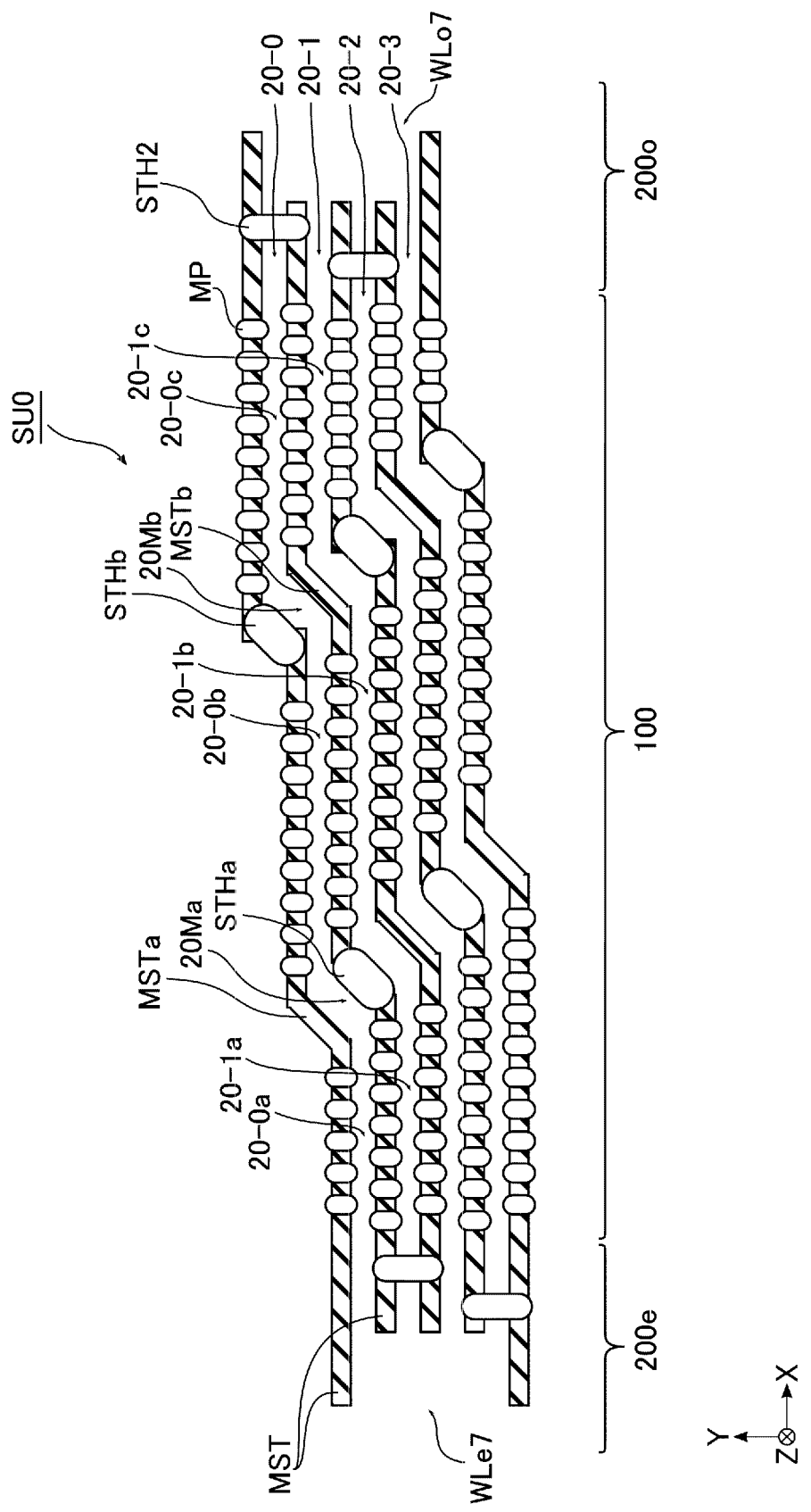
FIG. 16 is a plan layout of memory trenches, memory pillars, word lines, and slit regions in a first example according to a third embodiment.

Next, a semiconductor memory device according to a third embodiment will be described. The third embodiment is an instance in which an extension direction of the memory trench MST is parallel to the X direction, and the slit region STH and a part of memory trenches are alternately disposed between end portions of the memory trenches MST. In the third embodiment, differences from the first embodiment will be mainly described. Other configurations not described are the same as those of the first embodiment.
3.1 Detailed Configuration of Memory Array Region a. First Example FIG. 16 is a plan layout of the memory trenches MST, the memory pillars MP, the word lines WLe7 and WLo7, and the slit regions STH in the memory array region 100 of the first example.

In the first example according to the third embodiment, the extension direction of the memory trench MST is in parallel to the X direction, which is similar to the first embodiment. The plurality of memory trenches MST are arranged in the Y direction. The slit region STH and a memory trench MSTa (or MSTb) are alternately disposed so as to connect end portions of two memory trenches MST. A major axis direction of the slit region STH and a longitudinal direction of the memory trench MSTa are oblique to the extension direction of the memory trench MST.

In other words, in the layout illustrated in FIG. 11, the slit region STH disposed between the end portions of the memory trenches MST is alternately replaced with the memory trench MSTa (or MSTb).

The slit region STH (STHa or STHb) and the memory trench MSTa (or MSTb) are respectively arranged in a staggered manner in a plurality of adjacent Y-direction oblique arrangements. For instance, when two memory trenches MST that sandwich the conductive layer 20-0 are respectively set as a first memory trench and a second memory trench, the memory trench MSTa and the slit region STHb are disposed in order in the first memory trench. On the other hand, the slit region STHa and a memory trench MSTb are disposed in order in the second memory trench.

Other configurations are the same as those of the second example according to the first embodiment described above.

b. Second Example

Figure 17:
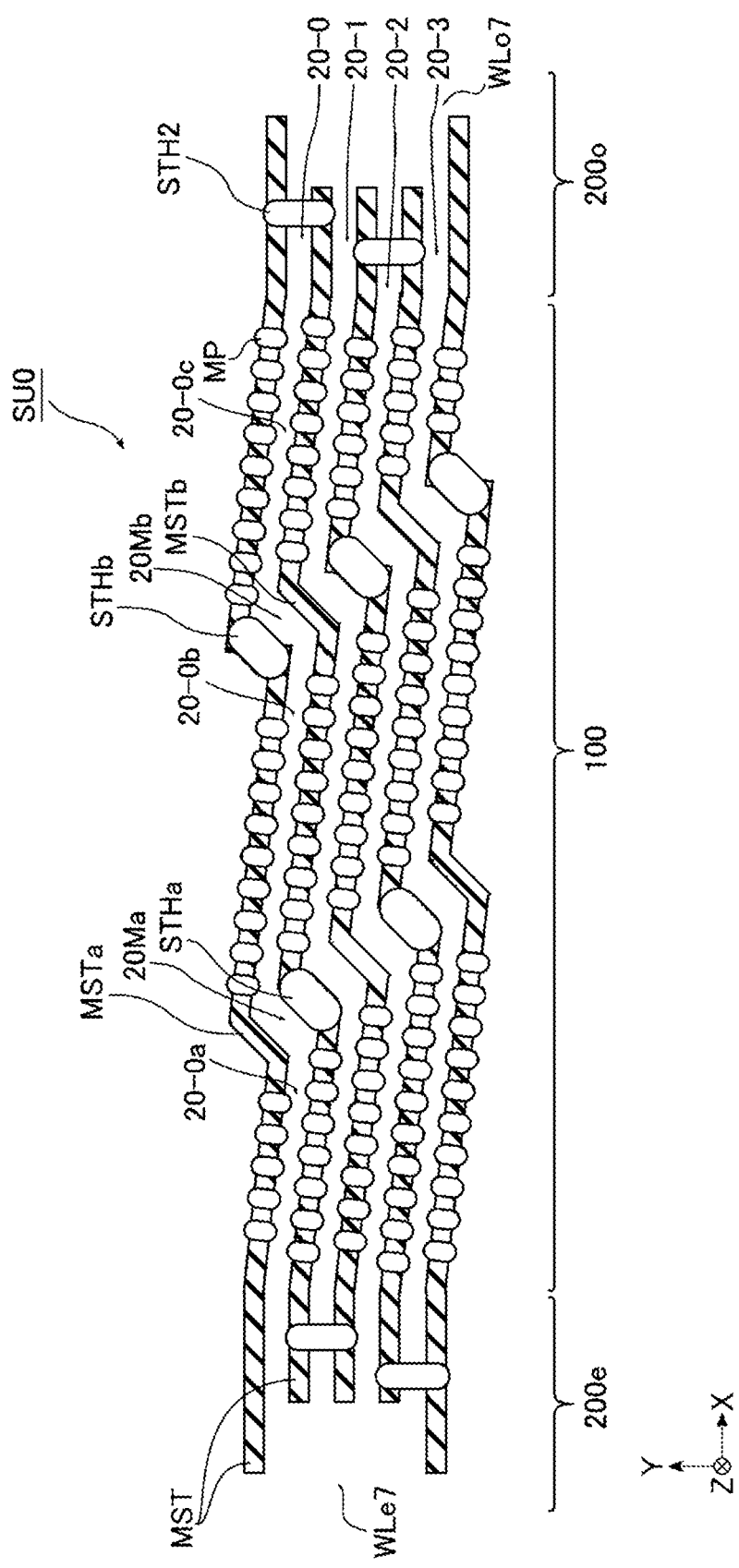
FIG. 17 is a plan layout of memory trenches, memory pillars, word lines, and slit regions in a second example according to the third embodiment.

FIG. 17 is a plan layout of the memory trenches MST, the memory pillars MP, the word lines WLe7 and WLo7, and the slit regions STH in the memory array region 100 of the second example.

In the second example, an extension direction of the memory trench MST is oblique to the X direction, which is similar to the second embodiment. The slit region STH and the memory trench MSTa (or MSTb) are alternately disposed so as to connect end portions of the memory trenches MST. A major axis direction of the slit region STH and a longitudinal direction of the memory trench MSTa are oblique to the extension direction of the memory trench MST.

In other words, in the layout illustrated in FIG. 14, the slit region STH disposed between the end portions of the memory trenches MST is alternately replaced with the memory trench MSTa (or MSTb).

The slit region STH (STHa or STHb) and the memory trench MSTa (or MSTb) are respectively arranged in a staggered manner in a plurality of adjacent Y-direction oblique arrangements. For instance, when two memory trenches MST that sandwich the conductive layer 20-0 are respectively set as a first memory trench and a second memory trench, the memory trench MSTa and the slit region STHb are disposed in order in the first memory trench. On the other hand, the slit region STHa and the memory trench MSTb are disposed in order in the second memory trench.

Other configurations are the same as those of the second example according to the second embodiment described above.

3.2 Effects of Third Embodiment

According to the third embodiment, it is possible to provide a semiconductor memory device that allows high-density arrangement of memory cells, which is similar to the first embodiment.

In the third embodiment, the slit region STH and the memory trench MSTa (or MSTb) are alternately disposed in an insulating region that connects end portions of two memory trenches MST. Accordingly, an arrangement pitch of the memory trenches MST in the Y direction can be further reduced, a distance between the slit region STH and the memory trench MSTa can be increased, and a width of a minor axis of the slit region STH can be increased. Accordingly, the number of the memory trenches MST (or memory pillars MP) that can be disposed in the memory cell array can be increased, memory cells can be disposed in high density, and reliability of the memory cells provided in the memory cell array can be improved.

4. Other Modifications

In the above embodiments, a NAND flash memory is described as an instance of a semiconductor memory device. However, embodiments of the present disclosure are not limited thereto. The embodiments of the present disclosure can be applied to other semiconductor memories in general, and can be applied to various memory devices other than the semiconductor memory.

While certain embodiments are described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of first conductive layers that are stacked in a first direction on a substrate and extend in a second direction intersecting the first direction;
   a plurality of second conductive layers that are stacked in the first direction on the substrate and extend in the second direction, the second conductive layers being apart from the plurality of first conductive layers in a third direction intersecting the second direction;
   a plurality of third conductive layers that are stacked in the first direction on the substrate, wherein corresponding conductive layers of the first, second, and third pluralities of conductive layers are electrically connected;
   a first insulating layer and a second insulating layer that extend in the first direction and the second direction, and are arranged in the third direction to be on both sides of the plurality of first conductive layers;
   a third insulating layer and a fourth insulating layer that extend in the first direction and the second direction, and are arranged in the third direction to be on both sides of the plurality of second conductive layers;
   a first insulating region and a second insulating region that extend in the first direction and are on both sides of the third conductive layers; and
   a plurality of pillars that are disposed through the first insulating layer, the second insulating layer, the third insulating layer and the fourth insulating layer, respectively, and extend in the first direction, wherein
   the first insulating region is disposed between an end portion of the first insulating layer and an end portion of the third insulating layer, and
   the second insulating region is disposed between an end portion of the second insulating layer and an end portion of the fourth insulating layer.

2. The semiconductor memory device according to claim 1, wherein each of the first insulating region and the second insulating region is disposed along the third direction.

3. The semiconductor memory device according to claim 1, wherein each of the first and second insulating regions is disposed in a fourth direction that intersects the first direction and is different from the second direction and the third direction.

4. The semiconductor memory device according to claim 3, wherein an angle between the first insulating region and the first insulating layer and an angle between the second insulating region and the second insulating layer are not equal to 90 degrees.

5. The semiconductor memory device according to claim 1, wherein each of the first insulating region and the second insulating region has an oval shape, and a long axis direction of the oval shape is the third direction.

6. The semiconductor memory device according to claim 1, wherein each of the first insulating region and the second insulating region has an oval shape, a long axis direction of the first insulating region is oblique to the first insulating layer, and a long axis direction of the second insulating region is oblique to the second insulating layer.

7. The semiconductor memory device according to claim 1, wherein the third conductive layers are connected to respective end portions of the first and second conductive layers, and wherein
   the first conductive layers and the second conductive layers are oblique to the third conductive layer.

8. The semiconductor memory device according to claim 1, wherein a portion of each of the pillars intersecting with one of the first conductive layers is configured as a memory cell transistor.

9. A semiconductor memory device comprising:
   a substrate;
   a first insulating layer that extends in a first direction perpendicular to a substrate surface and a second direction which intersects the first direction;
   a second insulating layer that extends in the first direction and in the second direction and is disposed apart from the first insulating layer in a third direction which intersects the first direction and the second direction;
   a third insulating layer that extends in the first direction and the second direction and is disposed apart from the first insulating layer in the third direction;
   a fourth insulating layer that extends in the first direction and the second direction and is disposed apart from the third insulating layer in the third direction, the fourth insulating layer being aligned with the first insulating layer in the second direction;
   a first conductive layer that is provided between the first insulating layer and the second insulating layer and extends in the second direction;
   a second conductive layer that is provided between the third insulating layer and the fourth insulating layer and extends in the second direction;
   a third conductive layer electrically connected to the first conductive layer and the second conductive layer;
   a first insulating portion connected to one end of the first insulating layer and one end of the third insulating layer;
   a second insulating portion connected to one end of the second insulating layer and one end of the fourth insulating layer;
   a plurality of signal lines that are disposed on the substrate and extend in the first direction; and
   each of the signal lines comprises at least one memory cell configured to store information.

10. The semiconductor memory device according to claim 9, wherein the third conductive layer is provided between the first insulating portion and the second insulating portion.

11. The semiconductor memory device according to claim 9, wherein one end of the second insulating layer protrudes in the second direction from the first insulating region.

12. The semiconductor memory device according to claim 9, wherein a width of the first insulating portion and a width of the second insulating portion are greater in the third direction than in the second direction.

13. The semiconductor memory device according to claim 9, wherein the first insulating portion and the second insulating portion extend in a direction from the second direction toward the third direction.

* * * * *